United States Patent [19]
Fandrich et al.

[11] Patent Number: 5,509,134
[45] Date of Patent: Apr. 16, 1996

[54] METHOD AND APPARATUS FOR EXECUTION OF OPERATIONS IN A FLASH MEMORY ARRAY

[75] Inventors: Mickey L. Fandrich, Placerville; Richard J. Durante, Citrus Heights; Keith F. Underwood, Orangevale; Rodney R. Rozman, Placerville, all of Calif.

[73] Assignee: Intel Corporation, Santa Clara, Calif.

[21] Appl. No.: 86,186

[22] Filed: Jun. 30, 1993

[51] Int. Cl.[6] .................................................. G11C 8/00
[52] U.S. Cl. ..................................... 395/430; 365/189.05
[58] Field of Search .............................. 395/500, 183.06, 395/183.10, 375, 430, 500, 733, 800; 365/230.06, 185, 189.05, 230.01, 900

[56] References Cited

U.S. PATENT DOCUMENTS

| | | | |
|---|---|---|---|
| 4,151,598 | 4/1979 | Webster | 395/444 |
| 4,330,824 | 5/1982 | Girard | 395/309 |
| 4,649,511 | 3/1987 | Gdula | 395/433 |
| 5,053,990 | 10/1991 | Kreifels et al. | 364/900 |
| 5,159,672 | 10/1992 | Salmon et al. | 395/494 |
| 5,200,922 | 4/1993 | Rao | 365/185 |
| 5,222,046 | 6/1993 | Kreifels et al. | 365/230.03 |
| 5,224,070 | 6/1993 | Fandrich et al. | 365/185 |
| 5,239,639 | 8/1993 | Fischer et al. | 395/494 |
| 5,263,003 | 11/1993 | Cowles et al. | 365/230.03 |
| 5,265,059 | 11/1993 | Wells et al. | 365/204 |
| 5,297,103 | 3/1994 | Higuchi | 365/230.03 |
| 5,341,330 | 8/1994 | Wells et al. | 365/185 |
| 5,353,256 | 10/1994 | Fandrich et al. | 365/230.03 |
| 5,355,464 | 10/1994 | Fandrich et al. | 395/218 |

OTHER PUBLICATIONS

1992 Intel Memory Book, pp. 6–55 to 6–80.

*Primary Examiner*—Robert B. Harrell
*Assistant Examiner*—Viet Vu
*Attorney, Agent, or Firm*—Blakely, Sokoloff Taylor & Zafman

[57] ABSTRACT

A flash memory system includes a user interface and array controller. The user interface receives the user command issued by the processor and has the ability to queue a plurality of commands for execution. The user interface further functions as an arbiter to control the priority of commands to be executed. The array controller performs the operations on the flash array such as program and erase. The array controller consists of a general purpose processor with program memory which is programmable by the user. The program memory stores one or more algorithms that can be executed by the array controller. The algorithm is selected according to the command received at the user interface. The algorithms can be customized simply by programming the program memory. The system further provides an interrupt mechanism which enables the flash memory system to perform a context switch of a higher priority command with the lower priority, but currently executing, command.

108 Claims, 20 Drawing Sheets

| COMMAND CODE | FACE VECTOR | FACE OPERATION |
|---|---|---|
| 20 | 17 | Single Block Erase - 20 is the setup to erase the block specified by the address provided during the second cycle. The 2nd cycle must have D0 in its data to successfully use this command (confirm). |
| 16 | 01 | Custom Algorithm |
| 26 | 02 | This FACE vector is reserved for 3 cycle Write Without Page Buffer command: *Test Mode Enabled by FACE algorithm* command (code 2AH). |
| 36 | 03 | This FACE vector is reserved for 3 cycle Write With Page Buffer command: *Dump Algorithm Code Revision ID to Page Buffer.* |
| 46 | 04 | Custom Algorithm |
| 56 | 05 | Custom Algorithm |
| 66 | 06 | Custom Algorithm |
| 76 | 07 | Custom Algorithm |
| 86 | 08 | Custom Algorithm |
| 96 | 09 | Reconfigure Ready/ Busy pin architecture. The chip defaults to a *Non-pulsed Open Drain Ready/Busy Buffer.* After issuing this command, the R/B# output is transformed into a "pulsed" R/B# scheme. |
| A6 | 0A | Custom algorithm |
| B6 | 0B | Custom algorithm |
| C6 | 0C | Custom Algorithm |
| D6 | 0D | Custom Algorithm |
| E6 | 0 E | Custom Algorithm |
| F6 | 0 F | Custom Algorithm |

2 Cycle Write Without Page Buffer

FIG. 4a

| COMMAND CODE | FACE VECTOR | FACE OPERATION |
|---|---|---|
| 40 | 1F | Byte/Word - program byte/word sequence. Command "10" is also mapped to this "40" command, and does exactly the same thing (AMD compatible cmd). |
| 17 | 11 | Custom Algorithm |
| 27 | 12 | Custom Algorithm |
| 37 | 13 | Custom Algorithm |
| 47 | 14 | Custom Algorithm |
| 57 | 15 | Custom Algorithm |
| 67 | 16 | Custom Algorithm |
| 77 | 10 | NV Lock Bit Set - sets the NV Lock bit depending on the state of the WPBPAD pin (WPBPAD must be high to allow command to execute). On the 2nd cycle the data must be D0H, used as a confirm code, and the address chooses the block to lock. |
| 87 | 18 | Custom Algorithm |
| 97 | 19 | Load NV Lock Bits - This algorithm loads the status of the NV lock bits for each of the array erase blocks into the Block Locked Bit (Bit 6) of the BSRs. On the 2nd cycle the data must be D0H, used as a confirmed code, and the address is a don't care. |
| A7 | 1A | Full Chip Erase - A7 is the setup to erase all blocks of the chip that are not protected by NV lock bit. The 2nd cycle must have D0 in its data to successfully use this command (confirm). |
| B7 | 1B | Lock all blocks |
| C7 | 1C | Custom Algorithm |

2 Cycle Write Without Page Buffer

FIG. 4b

| COMMAND CODE | FACE VECTOR | FACE OPERATION |
|---|---|---|
| D7 | 1D | Custom Algorithm |
| E7 | 1E | Custom Algorithm |
| F7, 06 or 07 | 00 | This FACE vector is reserved for 3 cycle Write With Page Buffer command: *Program Bytes/Words From Page Buffer* command (code 0CH). |

2 Cycle Write Without Page Buffer

FIG. 4c

| COMMAND CODE | FACE VECTOR | FACE OPERATION |
|---|---|---|
| 79 | 17 | This FACE vector is reserved for 2 Cycle Write Without Page Buffer command: *Single Block Erase* (code 20H). |
| 18 | 01 | Custom Algorithm |
| 28 | 02 | This FACE vector is reserved for 3 cycle Write Without Page Buffer command: *Test Mode Enabled by FACE Algorithm* command (code 2AH). |
| 38 | 03 | Dump Algorithm Code Revision ID To Page Buffer. Data D0 is used as the confirm. Puts data into Page Buffer location 0 in the selected page buffer. |
| 48 | 04 | Custom Algorithm |
| 58 | 05 | Custom Algorithm |
| 68 | 06 | Custom Algorithm |
| 78 | 07 | Custom Algorithm |
| 88 | 08 | Custom Algorithm |

2 Cycle Write With Page Buffer

FIG. 4d

| COMMAND CODE | FACE VECTOR | FACE OPERATION |
|---|---|---|
| 98 | 09 | This FACE vector is reserved for 2 cycle Write Without Page Buffer command: *Reconfigure Ready/Busy Architecture* (code 96H). |
| A8 | 0A | Custom Algorithm |
| B8 | 0B | Custom Algorithm |
| C8 | 0C | Custom Algorithm |
| D8 | 0D | Custom Algorithm |
| E8 | 0 E | Custom Algorithm |
| F8 | 0 F | Custom Algorithm |
| 09 | 10 | This FACE vector is reserved for 2 Cycle Write Without Page Buffer: *NV Lock Bit Set* (code 77H). |
| 19 | 11 | Custom Algorithm |
| 29 | 12 | Custom Algorithm |
| 39 | 13 | Custom Algorithm |
| 49 | 14 | Custom Algorithm |
| 59 | 15 | Custom Algorithm |
| 69 | 16 | Custom Algorithm |
| 08 | 00 | This FACE vector is reserved for 3 cycle Write With Page Buffer command: *Program Bytes/Word From Page Buffer* command (code 0CH). |
| 89 | 18 | Custom Algorithm |
| 99 | 19 | This FACE vector is reserved for 2 Cycle Write Without Page Buffer command: *Load NV Lock Bits* (code 97H). |
| A9 | 1A | This FACE vector is reserved for 2 Cycle Write Without Page Buffer command: *Full Chip Erase* (code A7H). |

2 Cycle Write With Page Buffer

FIG. 4e

| COMMAND CODE | FACE VECTOR | FACE OPERATION |
|---|---|---|
| B9 | 1B | Custom Algorithm |
| C9 | 1C | Custom Algorithm |
| D9 | 1D | Custom Algorithm |
| E9 | 1E | Custom Algorithm |
| F9 | 1F | This FACE vector is reserved for 2 cycle Write Without Page Buffer command: *Program Bytes/Word* command (code 10H or 40H), and *3 Cycle Write Without Page Buffer* command: Program Word in X8 device (code FBH). Both commands use the same FACE algorithm. |

2 Cycle Write With Page Buffer

FIG. 4f

| COMMAND CODE | FACE VECTOR | FACE OPERATION |
|---|---|---|
| 0A | 00 | This FACE vector is reserved for 3 cycle Write With Page Buffer command: *Program Bytes/Words From Page Buffer* command (code 0CH). |
| 1A | 01 | Custom Algorithm |

3 Cycle Write Without Page Buffer

FIG. 4g

| COMMAND CODE | FACE VECTOR | FACE OPERATION |
|---|---|---|
| 2A | 02 | "Test Modes Enabled by FACE" algorithm. 1st cycle address is don't care, data is 2AH. 2nd cycle: data is D0H (confirm), address is don't care. 3rd cycle: data is D0H (confirm), and the address is 0F1E2H (some arbitrary number as a key). The data and address in the 2nd and 3rd cycles are used by the FACE algorithm as a "key" to invoke the command. |
| 3A | 03 | This FACE vector is reserved for 3 cycle Write With Page Buffer command: *Dump Algorithm Code Revision ID to Page Buffer.* |
| 4A | 04 | Custom Algorithm |
| 5A | 05 | Custom Algorithm |
| 6A | 06 | Custom Algorithm |
| 7A | 07 | Custom Algorithm |
| 8A | 08 | Custom Algorithm |
| 9A | 09 | This FACE vector is reserved for 2 Cycle Write Without Page Buffer command: *Reconfigure Ready/Busy Architecture* (code 96H). |
| AA | 0A | Custom Algorithm |
| BA | 0B | Custom Algorithm |
| CA | 0C | Custom Algorithm |
| DA | 0D | Custom Algorithm |
| EA | 0E | Custom Algorithm |
| FA | 0F | Custom Algorithm |
| 0B | 10 | This FACE vector is reserved for 2 Cycle Write Without Page Buffer: *NV Lock Bit Set* (code 77H). |
| 1B | 11 | Custom Algorithm |

3 Cycle Write Without Page Buffer

FIG. 4h

| COMMAND CODE | FACE VECTOR | FACE OPERATION |
|---|---|---|
| 2B | 12 | Custom Algorithm |
| 3B | 13 | Custom Algorithm |
| 4B | 14 | Custom Algorithm |
| 5B | 15 | Custom Algorithm |
| 6B | 16 | Custom Algorithm |
| FB | 1F | Program Word in X8 Device - used to program 2 bytes of data in a x8 device, without doing 2 Program Byte commands (to save time). |
| 8B | 18 | Custom Algorithm |
| 9B | 19 | This FACE vector is reserved for 2 Cycle Write Without Page Buffer command: *Load NV Lock Bits* (code 97H). |
| AB | 1A | This FACE vector is reserved for 2 Cycle Write without Page Buffer command: *Full Chip Erase* (code A7H). |
| 7B | 17 | This FACE vector is reserved for 2 Cycle Write Without Page Buffer: *Single Block Erase* (code 20H). |
| BB | 1B | Custom Algorithm |
| CB | 1C | Custom Algorithm |
| DB | 1D | Custom Algorithm |
| EB | 1E | Custom Algorithm |

3 Cycle Write Without Page Buffer

FIG. 4i

| COMMAND CODE | FACE VECTOR | FACE OPERATION |
|---|---|---|
| 0C | 00 | Program Bytes/Words From Page Buffer - number of bytes to pgm from page buffer is given during 2nd and 3rd cycle of command. |
| 1C | 01 | Custom Algorithm |
| 2C | 02 | This FACE vector is reserved for 3 cycle Write Without Page Buffer command: *Test Mode Enabled by FACE Algorithm* command (code 2AH). |
| 3C | 03 | This FACE vector is reserved for 3 cycle Write With Page Buffer command: *Dump Algorithm Code Revision ID To Page Buffer.* |
| 4C | 04 | Custom Algorithm |
| 5C | 05 | Custom Algorithm |
| 6C | 06 | Custom Algorithm |
| 7C | 07 | Custom Algorithm |
| 8C | 08 | Custom Algorithm |
| 9C | 09 | This FACE vector is reserved for 2 cycle Write Without Page Buffer command: *Reconfigure Ready/Busy Architecture* (code 96H). |
| AC | 0A | Custom Algorithm |
| BC | 0B | Custom Algorithm |
| CC | 0C | Custom Algorithm |
| DC | 0D | Custom Algorithm |
| EC | 0E | Custom Algorithm |
| FC | 0F | Custom Algorithm |
| 0D | 10 | This FACE vector is reserved for 2 cycle Write Without Page Buffer: *NV Lock Bit Set* (code 77H). |
| 1D | 11 | Custom Algorithm |

3 Cycle Write With Page Buffer

FIG. 4j

| COMMAND CODE | FACE VECTOR | FACE OPERATION |
|---|---|---|
| 2D | 12 | Custom Algorithm |
| 3D | 13 | Custom Algorithm |
| 4D | 14 | Custom Algorithm |
| 5D | 15 | Custom Algorithm |
| 6D | 16 | Custom Algorithm |
| FD | 1F | This FACE vector is reserved for 2 cycle Write Without Page Buffer command: *Program Bytes/Word* command (code 10H or 40H), and *3 Cycle Write Without Page Buffer* command: *Program Word in X8 device* (code FBH). Both commands use the same FACE algorithm. |
| 8D | 18 | Custom Algorithm |
| 9D | 19 | This FACE vector is reserved for 2 Cycle Write Without Page Buffer command: *Load NV Lock Bits* (code 97H). |
| AD | 1A | This FACE vector is reserved for 2 Cycle Write Without Page Buffer command: *Full Chip Erase* (code A7H). |
| 7D | 17 | This FACE vector is reserved for 2 cycle Write Without Page Buffer command: *Single Block Erase* (code 20H). |
| BD | 1B | Custom Algorithm |
| CD | 1C | Custom Algorithm |
| DD | 1D | Custom Algorithm |
| ED | 1E | Custom Algorithm |

3 Cycle Write With Page Buffer

FIG. 4k

| BIT | MNEMONIC | DEFINITION |
|---|---|---|
| 7 | BLK RDY/BUSY# | BLOCK READ/BUSY. '0' INDICATES THAT THE BLOCK IS BUSY. (BSR SPECIFIC). RESET ON POWER UP. (FUI READY A '1' AND FACE READS A '0'.) |
| 6 | NV LOCK BIT | '0' ON PWRUP. '0' LOCKS THE BLOCK FROM PROGRAM AND ERASE OPERATIONS. (BSR SPECIFIC). RESET ON POWER UP. |
| 5 | OP FAIL | 1 = OPERATION ON THIS BLOCK FAILED. (BSR SPECIFIC). RESET ON POWER UP |
| 4 | ABORT | 1 = OPERATION ABORTED ON THIS BLOCK. (BSR SPECIFIC). REST ON POWER UP. |
| 3 | QFULL | 1 = OPERATION QUEUE IS FULL. (GLOBAL). (NO MORE COMMANDS ARE RECEIVED BY THE USER INTERFACE UNTIL THIS SET IS RESET TO 0.) |
| 2 | LOW VPP | 1 = VPP LOW DETECTED WHILE OPERATING ON THE BLOCK. (BSR SPECIFIC). RESET ON POWER UP. |
| 1 | RESERVED | RESERVED FOR FUTURE USE. VALUE IS NOT GUARANTEED AND SHOULD BE MASKED BY THE USER. RESET ON POWER UP. |
| 0 | RESERVED | RESERVED FOR FUTURE USE. VALUE IS NOT GUARANTEED AND SHOULD BE MASKED BY THE USER. REST ON POWER UP. |

FIG. 6b

METHOD AND APPARATUS FOR EXECUTION OF OPERATIONS IN A FLASH MEMORY ARRAY

BACKGROUND OF THE INVENTION

1. Field of the Invention

The present invention relates to flash memory. More particularly, the present invention relates to an apparatus and method for controlling flash memory operations.

2. Art Background

One type of prior non-volatile semiconducted memory is the flash electrically erasable programmable read-only memory ("flash"). The flash memory can be programmed with electrical signals and once programmed the flash memory retains its data until erased. After erasure, the flash memory may be programmed with new code or data.

Flash memories differ from conventional electrically erasable programmable read-only memory ("EEPROM") with respect to erasure. Conventional EEPROMs typically use the select transistor for individual byte erasure control. Flash memories, on the other hand, typically achieve much higher density with single transistor cells. During one prior art flash memory erase method, a high voltage is supplied to the sources of every memory cell in a memory array simultaneously. This results in a full array erasure. Typically a logical one means that few if any electrons are stored on a floating gate associated with a bit cell. Logical zero means that many electrons are stored on the floating gate associated with the bit cell. Erasure of the flash memory causes a logical one to be stored in each bit cell. Each single bit cell of that flash memory cannot be overwritten from a logical zero to a logical one without a prior erasure. Each single bit cell of that flash memory can however be overwritten from the logical one to a logical zero, given that this entails simply adding electrons to a floating gate that contains the intrinsic number of electrons associated with the erased state.

The process for erasure, programming and verification requires careful control of the voltages required to perform those steps. For example, one prior art flash memory is the 28F256 complimentary metal oxide semiconductor ("CMOS") flash memory sold by Intel Corporation of Santa Clara, Calif., which is a 256 kilobit flash memory. To control the flash memory, the memory includes a command register to manage electrical erasure and reprogramming. Commands are written for erasure from a controlling microprocessor using standard microprocessor write timings. The command register contents serve as input to an internal state machine that controls erasure and programming circuitry.

Due to increased densities of flash memory, the applications which include a flash memory have also increased. These applications vary dramatically and frequently require different processing and control mechanisms. Typically the applications are driven by a microprocessor coupled to the flash memory via a bus. However, if the overhead at the microprocessor is significant, flash processing throughput decreases. Furthermore, to ensure proper reliable operation of the flash memory, the erasure procedure should be strictly followed. Thus, the use of the microprocessor to control the flash memory over the bus and the interface of the user with the flash memory via the microprocessor increases the likelihood of flash error caused by, for example, over-erasure of the flash memory, due to ill-timed control signals caused by an interrupt or other operation which temporarily halts control signals being issued by the microprocessor.

In addition, it is typical that only one operation can be performed at a time at the flash memory. Thus if a low priority operation is executing and a higher priority operation is to be executed, the higher priority operation must wait for the lower priority operation to complete before the operation can be executed.

Furthermore, as the cost of flash memory decreases, the number of applications which utilize flash memory increases. Therefore, it is desirable to provide a flash memory and interface which is flexible and readily adaptable to a variety of applications.

SUMMARY OF THE INVENTION

The apparatus and method of the present invention provides an on chip mechanism for controlling the flash memory which provides dramatic flexibility in use and application and increases the overall throughput of operations to be performed. The overhead to the microprocessor is minimized and the danger of errors, caused by, for example, over-erasure of the flash array, is eliminated. The apparatus consists of a number of key elements which operate in conjunction with one another to provide full functionality and control of the flash array.

The circuitry, located on the same component as the memory array, consists of a user interface which receives address, command and data information across the bus from, for example, the microprocessor, and issues commands to the array controller which performs the erase and program operations identified by commands issued by the user interface. The array controller controls the flash array and the voltages required to perform specified operations in a manner independent of the user interface. Thus, great flexibility is achieved as the user interface can receive a variety of user commands and control the sequence of commands that are forwarded to the array controller for execution. Instruction pipelining is possible and provides the greatest throughput. Furthermore, the array controller performs operations based upon code stored in program memory. Therefore, new commands can be added or old commands can be changed without modification of the hardware by simply changing the microcode stored in memory.

The circuit also has the ability to perform a context switch of commands executed by the array controller. An innovative interrupt mechanism is provided which permits the safe interrupt of a process currently executing by another process, such that when the second process is complete, execution returns to the interrupted process at a predetermined "safe" point in the execution whereby the data in the array is not corrupted. For example, slow, low priority operations affecting one bank of the array can be suspended and a context switch performed in the array controller to permit a higher priority instruction to execute. Thus, when a time consuming operation such as an erasure of one or more banks of an array is executing, the user interface can issue a subsequent instruction to the array controller which the array controller can execute by performing a context switch of the erase instruction and the higher priority instruction to enable such operations as program during erase to execute.

BRIEF DESCRIPTION OF THE DRAWINGS

The objects, features and advantages of the present invention will be apparent to one skilled in the art from the following detailed description in which:

FIGS. 4a–4k are tables illustrating the command codes received and array controller vectors implemented in the system of the present invention.

FIG. 6a is a block diagram illustration of the structure of the block status registers of the present invention and FIG. 6b illustrates an exemplary configuration of the bits of the block status registers.

DETAILED DESCRIPTION OF THE INVENTION

In the following description for purposes of explanation, numerous details are set forth in order to provide a thorough understanding of the present invention. However, it will be apparent to one skilled in the art that these specific details are not required in order to practice the invention. In other instances, well known electrical structures and circuits are shown in block diagram form in order not to obscure the present invention unnecessarily.

Figure 1:
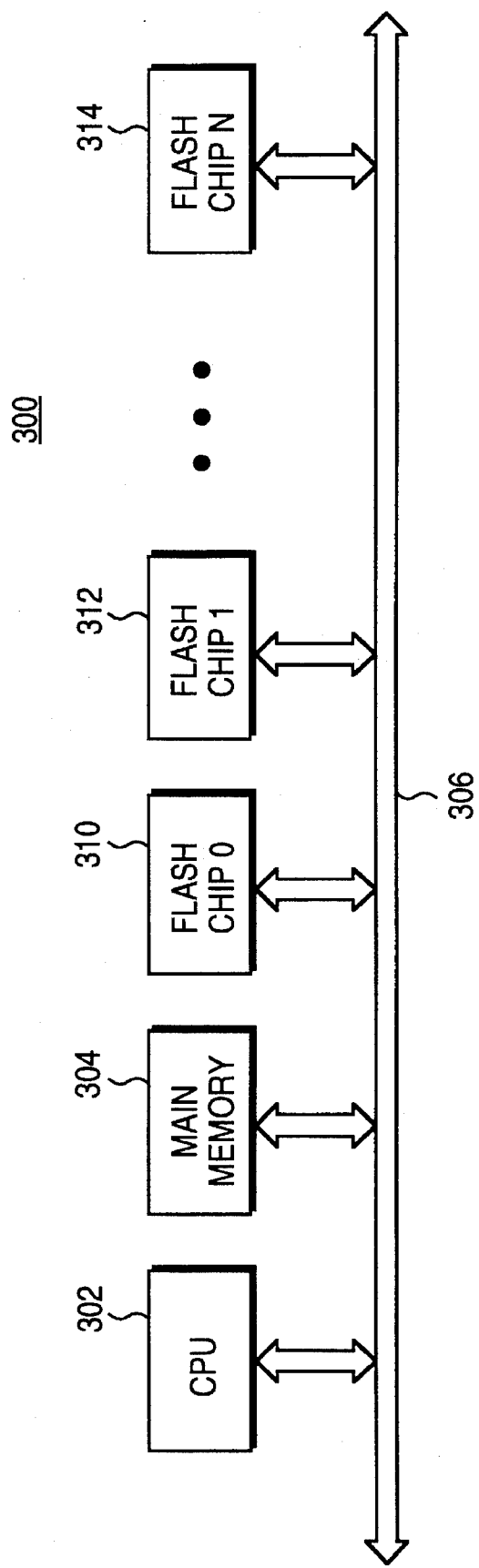
FIG. 1 is a block diagram illustration of a computer system including flash memory.

FIG. 1 is a block diagram of a computer system 300. The computer system 300 is comprised of a central processing unit (CPU) 302, a main memory subsystem 304, and a set of flash memory devices 310–314. The CPU 302 communicates with the main memory subsystem 304 and the flash memory devices 310–314 over a user bus 306.

The flash memory devices 310–314 provide random access non volatile large scale data storage for the computer system 300. The CPU 302 reads the contents of the flash memory devices 310–314 by generating read memory cycles over the user bus 306. The CPU 302 writes to the flash memory devices 310–314 by transferring write commands and write data blocks to the flash devices 310–314 over the user bus 306.

Figure 2:
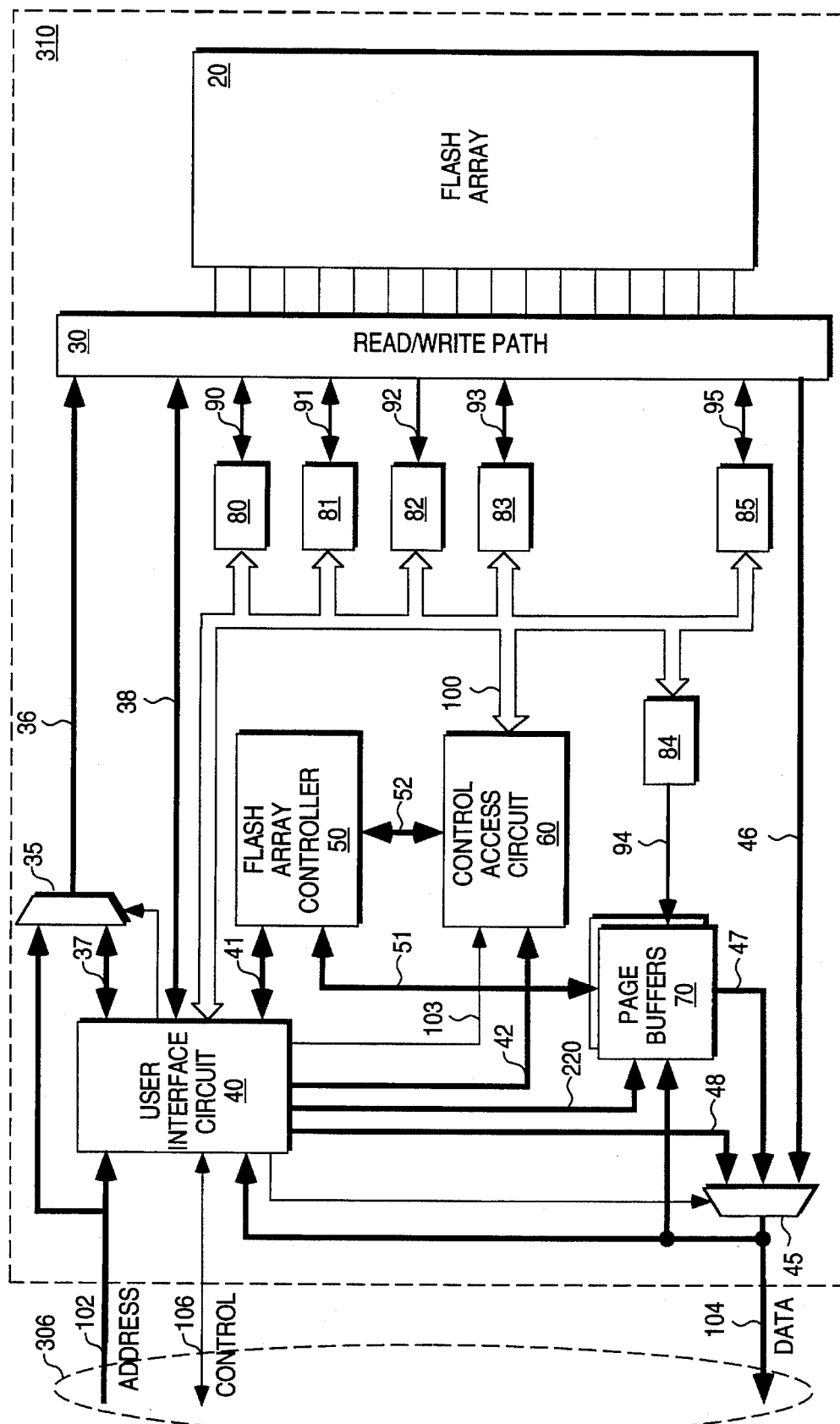
FIG. 2 is a block diagram of the flash memory system of the present invention.

A block diagram of the flash memory system 310 of the present invention is illustrated in FIG. 2. The flash memory system 310 is comprised of a flash cell array 20, a user interface circuit 40, a flash array controller 50, page buffer circuit 70, control register circuits 80–85, and read/write path circuitry 30. The flash cell array 20 provides random access non volatile large scale data storage. For one embodiment, the flash cell array 20 is arranged as a set of 32 flash array blocks. Each flash array block provides 64k bytes of data storage. The flash memory device 310 is shown coupled to the user bus 306. The user bus 306 comprises an user address bus 102, a user data bus 104, and a user control bus 106. User interface circuit 40 receives data, command and address information from a master device such as the microprocessor and stores the information in buffers. It should be noted that the buffers preferably each are multiple buffers to enable multiple requests from the microprocessor to be received and considered by the user interface circuit 40. Based on the state of the array controller 50, as will be explained below, certain of the commands may be put in the high priority position and context switched with the command currently executed by the array controller 50 in order to receive immediate execution. User interface circuit 40 further receives status information front the array controller 50 which the user interface circuit 40 can subsequently provide to the microprocessor.

The user interface circuit 40 enables access of the flash cell array 20 over the user bus 306 by receiving and processing communicated operation requests over the user bus 306. Upon receipt of an operation request at the user interface circuit 40, the address, data and command information received from the user bus 306 are stored in buffers located in the user interface circuit 40. If the requested operation is an array controller operation, such as a program or erase command, the command and data received by the user interface circuit 40 is subsequently transferred to the array controller 50 for execution of the requested command via a queue bus 41. Address information is forwarded by the user interface circuit 40 through multiplexor 35 to read/write path circuitry 30 for command execution at the address communicated over address lines 36. Read operations are permitted when the array controller is not operating. The user interface circuit 40 forwards the address to the read/write path circuitry 30 and sets the output multiplexor to output data read from the array.

The user interface circuit 40 and array controller 50 share a page buffer resource 70 which is accessible by both components and provides the flash memory system the ability to operate in a variety of ways. For example, the page buffer 70 can be used to buffer data that is to be programmed into the array 20 in order that sufficient data is accumulated to permit the data to be streamed into the array 20, resulting in increased throughput at the array 20.

This buffer is accessible by both the user interface and the array controller. For example, the page buffer is used to handle high speed write operations to the flash array. Data is preferably loaded into the page buffers by the user interface circuit for subsequent array write operations. User commands to write data located in the two page buffers to the array can be queued through the queue structure of the user interface circuit 40 in the same manner as other array controller commands. The array can then be programmed by execution of these commands using the data held in the page buffers. Thus, the user can load a page buffer, issue an array controller command that utilizes the contents of the page buffer and then load the second page buffer which the user interface would make available after the first array controller command was issued.

In the preferred embodiment the page buffer 310 is a 128×19×2 memory array of SRAM cells. It has several modes of operation and can be accessed by the array controller and the user interface. Depending on the mode, it is organized as an 8-bit, 16-bit or 19-bit memory. Also the mode can control whether it is one contiguous memory plane or two memory planes. Each plane is accessible simultaneously. When not in test mode, it is preferred that the page buffer is split into two planes of SRAM memory. This two plane architecture allows the array controller to have read/write access to one half of the memory and the user interface the other half at the same time. The half that is accessible is not fixed; rather, the ownership of the planes can switch back and forth. For example, this can be used by the user interface to pass a page of data to the array controller for page programming of the array. The user interface first fills one plane of the page buffer with data and then issues a command (jump offset) to the array controller to perform a page program. Through the use of internal logic and control signals, upon receiving the appropriate commands, the array controller points to the plane that the host CPU had just loaded, and the user interface takes control of the other plane to write data. Therefore, there are two page buffers which can be accessed independently, and page buffer programming can be pipelined and sequenced such that data streaming into the flash array can be achieved to increase data throughput.

The page buffer can be used by the array controller algorithms for various purposes. For example, a multiblock erase algorithm can use a page buffer to store multiblock erase information so that an interrupt can be serviced during its operation. The array controller can also use the page buffer to store jump offsets, data and address information for pipeline programming. Through the user interface, the external user can also use a page buffer as a fast read write memory by itself. During test modes, the array controller 20 can be instructed to execute instructions stored in the page buffer. The page buffer therefore can act as the microcode storage for the array controller. When in this mode, the page buffer's architecture is preferably reconfigured to one contiguous memory.

The array controller 50 controls through a central control bus 100 the different components needed to program, erase and verify the array 50. The array controller 50 is a specialized reduced instruction set processor for performing program and erase, and other operations on the array 20. The array controller 50 includes an arithmetic logic unit, general purpose registers, a control store and a control sequencer. The array controller 50 uses the information received over the queue bus 41 to access the appropriate location of the program memory to execute instructions needed to perform the operation. The array controller 50 executes the implementation algorithms for sequencing the high voltage circuitry of the read/write path 30 in order to apply charge to the flash cells of the array 20 and remove charge from the flash cells of the array 20. The array controller 50 controls the high voltage circuitry and addresses the array 20 by accessing the control register circuits 80–85 over the central control bus 100.

The read/write path circuitry 30 comprises read and write path circuitry for accessing the array 20. More particularly, the read/write path circuitry 30 includes source switch circuitry for applying the appropriate voltage levels to the array 20 for an erase function. The read/write path circuitry 30 also includes program load circuitry for driving program level voltages onto the bit lines of the array 20 during a programming function.

The control register circuits 80–85 contain sets of specialized control registers and associated circuitry for issuing control signals to the read/write path 30. The specialized control registers are written to and read from over a central control bus 100.

In the present embodiment, a control access circuit 60 enables both the user interface circuit 40 and the array controller 50 to access the control register circuits 80–85 over the central control bus 100. During a normal mode of the flash memory system 310, the array controller 50 controls the control access circuit 60 and accesses the control register circuits 80–85 over the central control bus 100.

In the present embodiment, the array controller 50 writes to the specialized control registers by transferring a write control signal, and a register address along with corresponding write data to the control access circuit 60 over a bus 52. The control access circuit 60 then generates a write cycle over the central control bus 100 to write to the addressed specialized control register. The array controller 50 reads the specialized control registers by transferring a register address and read control signal to the control access circuit 60 over the bus 52. The control access circuit 60 then generates a read access cycle over the central control bus 100 to read the addressed specialized control register.

For example, the control register circuit 80 contains specialized control registers and circuitry for controlling the high voltage circuitry of the read/write path 30 according to a set of control signals 90. The control register circuit 81 contains control registers and circuitry for controlling special column access circuitry of the read/write path 30 according to a set of control signals 91. The control register circuit 82 contains a set of read only registers for sensing and latching a set of status signals 92 from the read/write path 30. The control register circuit 83 contains control registers and circuitry for controlling the read path of the read/write path 30 according to a set of control signals 93. The control register circuit 84 contains registers for controlling a set of test modes of the page buffer circuit 70. The control register circuit 85 contains registers for controlling special test features of the flash memory system 310 according to a set of control signals 95.

The user interface circuit 40 controls an input address multiplexor 35 to select an input address 36 for the read/write path 30. The selected input address 36 is either the address sensed by TTL buffers (not shown) on the user address bus 102, or a latched address 37 from the user interface circuit 40. The input address 36 may be overridden by programming control registers in the control register circuit 84.

The user interface circuit 40 controls an output data multiplexor 45 to select a source for output data transfer over the user data bus 104. The selected output data is either flash array data 46 from the read/write path 30, page buffer data 47 from the page buffer circuit 70, or block status register (BSR) data 48 from a set of block status registers contained within the user interface circuit 40. Thus, the requesting device can receive data from the array as well as status information regarding the state of the flash memory system 310.

Therefore, the CPU 302 reads the array 20 by transferring addresses over the user address bus 102 while signaling read cycles over the user control bus 106. The user interface circuit 40 detects the read cycles and causes the input address multiplexor 35 to transfer the addresses from the user address bus 102 through to the x and y decode circuitry of the read/write path 30. The user interface circuit 40 also causes the output data multiplexor 45 to transfer the addressed read data from the read/write path 30 over the user data bus 104.

The CPU 302 writes data to the array 20 generating write cycles over the user bus 306 to transfer program commands and data to the user interface circuit 40. The user interface circuit 40 verifies the program commands, and queues the program commands and address and data parameters to the array controller 50. The array controller 50 performs the program operation by programming the specified data into the array 20 at the specified address.

The CPU 302 optionally writes data to the array 20 by generating write cycles over the user bus 306 to transfer program data to the page buffer circuit 70. The CPU 302 then transfers a program with page buffer command to the user interface circuit 40. The user interface circuit 40 verifies the program with page buffer command, and queues the program with page buffer command to the array controller 50. The array controller 50 executes the program with page buffer command by reading the program data from the page buffer circuit 70 and programming the program data into the array 20.

The page buffer circuit 70 is comprised of two separate static random access memory (SRAM) planes. The two SRAM planes are comprised of a plane 0 and a plane 1. The user interface circuit 40 allocates the plane 0 and plane 1 page buffer resources to user commands processed by the array controller 50. The user interface circuit 40 also allocates the page buffer resources plane 0 and plane 1 to user access. The page buffer resources plane 0 and 1 are also referred to as limited resources.

The interface circuit 40 contains 32 block status registers (BSRs). Each BSR corresponds to one of the blocks of the flash cell array 20. The flash array controller 50 maintains status bits in the block status registers to indicate the status of each block of the flash cell array 20. The CPU 302 reads the contents of the BSR over the user bus 306.

The user interface circuit 40 functions as an arbiter between the user or microprocessor issuing the commands and the array controller 50 which executes selected commands. For example, the user interface circuit 40 determines if the user's requested operation is valid given the current state of the array controller 50. The user interface 40 receives as input the command and address information off the bus 306 and determines the operation the array controller 50 should execute. Furthermore, the user interface circuit 40 controls queuing of address and data, user access to status registers, and the output multiplexor 45. A block diagram of the user interface circuit 40 is illustrated in FIG. 3.

Figure 3:
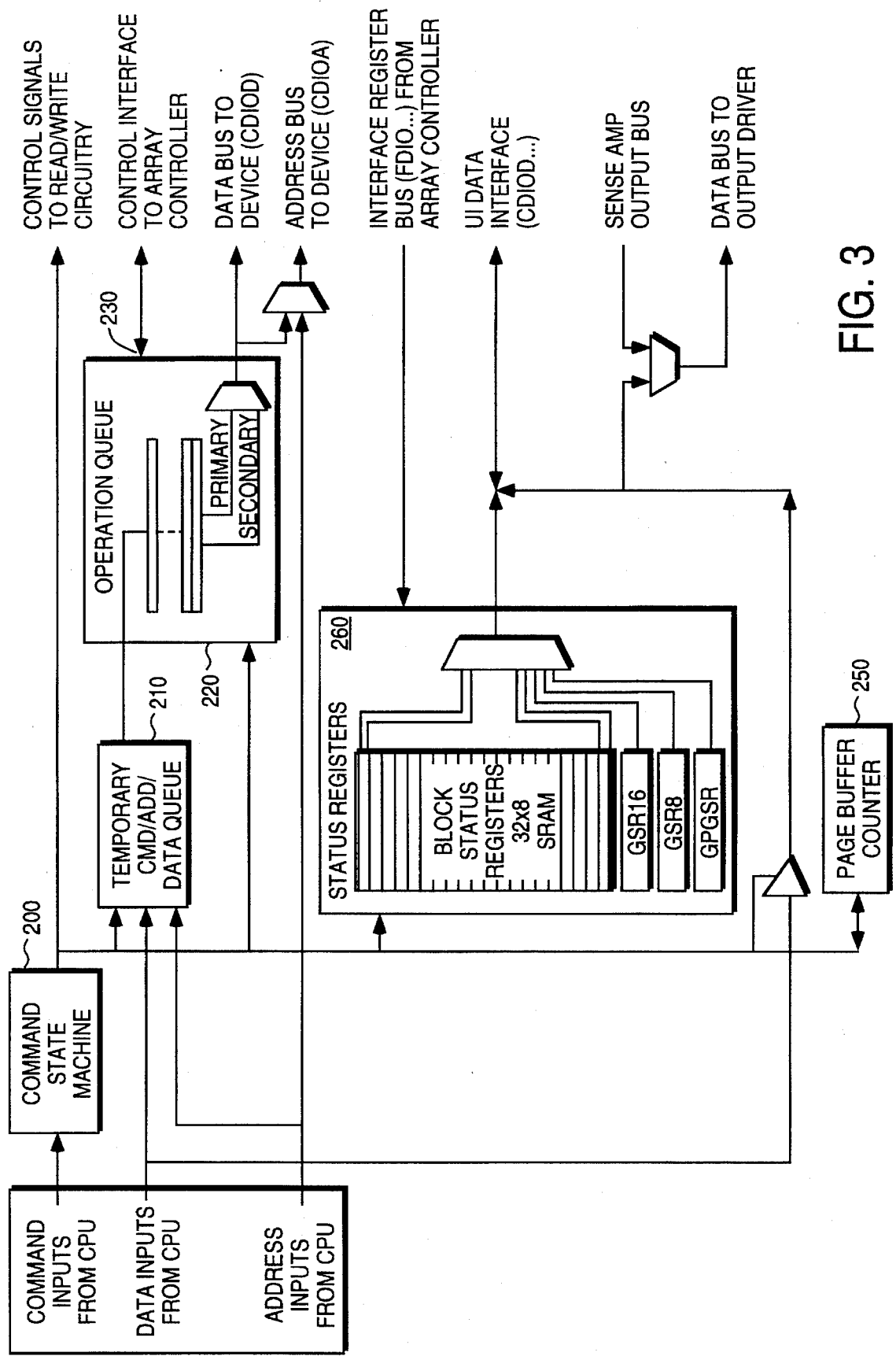
FIG. 3 is a block diagram of the user interface of the present invention.

Referring to FIG. 3, the command state machine 200 determines the operation to be performed based upon the command requests the CPU 302 presents through the user bus 306. The type of commands include array operations, as well as status register, test mode, and page buffer operations. The command state machine knows, through algorithms encoded in the circuitry, the command sequences that are legal, how to lock out the user from faulty command sequences and how to start and interrupt the array controller 50. The command is then forwarded to the array controller 50, if the operation is to be performed by the array controller 50. If a read operation is to be performed, the command state machine 200 sends the address to the read/write circuitry 30. The command state machine 200 controls the data available at the outputs through the output multiplexor (45, FIG. 2), and the inputs to the input multiplexor (35, FIG. 2). Furthermore, the command state machine 200 controls access to the status registers 260. Therefore, the command state machine 200 is the circuit that understands the user's command input received over the user bus 306 and dictates to the rest of the flash memory system 310 the steps that are to be performed in order to execute the user's command input.

If the requested command is one that is not executed by the array controller 50, for example, a read array or read status registers command, the user interface circuit 40 issues the appropriate control signals to cause execution of the requested command. If the command request received is one to be executed by the array controller 50, the command code representative of the command request received by the user interface circuit 40 is used to generate an index into the array controller 50 jump table (not shown) located in the user interface circuit 40. Depending upon the command received, see for example, FIG. 4, the offset vector stored in the jump table and mapped to the command code is sent to the array controller which uses the offset vector to address the code for the algorithm the array controller 50 performs to execute the command. Preferably, the offset vector references one of the first 32 locations of the program memory to determine the actual program memory address to begin execution. In the present embodiment, up to 128 commands in four different classes can be received and processed by the user interface circuit 40.

In the present embodiment, the jump table is preferably configured to map multiple commands to a single offset vector. The duplicity of offset vectors permits multiple classes of commands, distinguished by hardware configurations utilized, to map to the same array controller 50 algorithm. Therefore, multiple hardware configurations can be supported without modification of the user interface circuit 40 or array controller 50. In this regard, a command code translation mechanism generates the appropriate hardware control signals and the appropriate offset vector communicated to the array controller 50.

Preferably, the command code is received by the command state machine 200 for generation of the hardware control signals. The command is then forwarded to the temporary command/address/data queue 210 which includes the jump table for translation of the command code to an offset vector prior to output to the operation queue 230. The type of hardware signals generated is dependent upon the configuration of the system. For example, in the present embodiment, hardware signals are generated to identify if a page buffer is to be used and which page buffer is to be used and whether the operation to be performed is an eight bit or sixteen bit operation.

Referring back to FIG. 4, a number of command codes and array controller offset vectors are allocated for custom algorithms to be performed by the array controller 50. To customize the flash memory system 310, the array controller program memory is simply loaded with code to perform the custom algorithm. Therefore, the flash memory system 310 can be customized to perform commands specific to a particular user's application. Furthermore, the command set is flexible, allowing new commands to be added or old command functions changed, without changing the user interface circuit 40.

A command function can be easily changed by revising the program memory addresses stored in the first 32 locations in program memory to reference different program memory locations. In addition, the function of the array controller 50 is not limited to algorithms provided to the system at time of manufacture. The system provides for updatable program memory, such as flash program memory, which permits the update, modification and addition of array controller algorithms subsequent to manufacture. Preferably, the program memory is updated through a predetermined command issued by the CPU (user) to update the program memory. The user interface, upon receipt of the command, causes the array controller to execute an algorithm temporarily stored in the page buffer which enables the array controller to update the program memory. In *this manner the beginning addresses for the algorithms and the algorithms themselves can be modified, deleted or added. For example, the program memory can be updated with a new algorithm received from the user.

If a command is to be executed by the array controller 50, the command, address and data information are provided to the temporary queue 210 for processing by the user interface circuit 40. In particular, once command, data and address information are received in the temporary queue 210, and the command is translated to offset vector, the information is forwarded to the operation queue 220. As the array controller commands are provided to the command state machine 200, the command state machine 200 forwards the commands and address/data information to temporary queue 210 which forwards them to subsequently the operation queue 230. The temporary queue 210 holds the commands until the operation queue 230 is ready to accept the command into one of the active queues. The transfer of information to the temporary queue is synchronized to the write enable clock received via the user control bus 106. The operation queue 230 takes commands from the temporary queue 210 and places it into an active queue which is driven by the array controller clock. When the command state machine 200 transfers information to the temporary queue 210 it also sets a flag which tells the operation queue 230 that a command is waiting to be added to the active queues. Once the operation queue 230 moves the command from the temporary queue 210 to one of the queues, the flag is reset. This flag is also used by the status registers 260 as the queue full bit. This queue full bit is used to tell the user not to issue a command to the memory system 310 that requires execution by the array controller 50 until the bit is cleared.

Preferably the operation queue 220 has the ability to queue up to two operations; however, it is readily apparent that more than two operations can be queued. The primary queue is indicative of the operation to be executed or is executing. The secondary queue contains data for the next operation to be performed once execution of the operation located in the primary queue is complete. Once execution by the array controller 50 of the operation located in the primary queue is complete, the primary operation is removed from the operation queue to permit the next operation to be executed by the array controller 50. If a command to be executed is stored in the temporary queue 210, the offset vector, data and address are transferred to the operation queue 230 for subsequent execution. As will be explained below in detail, in certain cases it is desirable to perform an operation located in the secondary queue prior to completion of the primary operation. An innovative context switch process is performed between the primary and secondary operation to execute the operation located in the secondary queue before completion of the operation located in the primary queue.

Upon receipt of a command to be executed by the array controller 50, the user interface circuit 40 issues a signal to the array controller 50 to start up the local oscillator of the array controller 50 which provides the clock signals to drive the array controller 50. Once the array controller 50 is operating, the offset vector is transferred from the user interface to the array controller 50 to index the program memory. The address and data information stored in the operation queue 230 can be provided directly to the read/ write circuitry 30 or from the control registers and execution of operations using the address and data information at the read/write circuitry 30 are controlled by the array controller 50 as dictated by the algorithm executed from program memory.

The operation queue 220 is preferably a state machine which receives the offset vectors and address and data information from the temporary queue 210 and queues the vectors and associated address and data information for access by the array controller 50.

In the preferred embodiment, to support command queuing and pipelining into the user interface circuit 40, three layers of commands are queued. For example, when a command received requires an array controller 50 operation and one is not one currently executing, the user interface circuit 40 will load the top of the operation queue (also referred to as the primary queue) with the data for the operation and initiate operation of the array controller 50. Typically, the array controller 50 will have at its disposal the contents of the command information at the top of the queue with the bottom of the queue available for another command to be issued across the user bus 306, through the command state machine 200 and possibly the temporary queue 210. This architecture permits the user to issue an array controller operation or any other valid command to the user interface circuit 40 while the array controller 50 is executing the first command. Upon receipt of a subsequent command, the user interface circuit 40 notifies the array controller 50 that a new operation has been placed into the queue and the array controller algorithm that is currently running will determine if the array controller 50 should interrupt its operation to handle the queued operation or complete the operation in process first. The criteria for determining whether to interrupt the algorithm currently executed by the array controller 50 is preferably contained in the logic of the algorithm executing. For example, the algorithm for erasure of a block contains code that may indicate that a subsequent program command can interrupt the execution of the erase algorithm.

The structure of the user interface circuit 40 enables commands to be pipelined in the operation queue 230. For example, a program byte or two program byte/word commands can be pipelined, a program byte/word and erase single block can be pipelined (with respect to different blocks of the memory array), an erasure of one block and the programming of another block from page buffer commands can be pipelined, a program array from page buffer command and erase in another block, as well as other special algorithms can be pipelined.

A plurality of status registers 260 are included in the user interface circuit 40. Some of the status registers are read and write accessible by the array controller 50 and read accessible by the user interface circuit 40 while other registers are read and write accessible by the user interface circuit 40. Each status register is read accessible by the user interface in order that information regarding the state of execution of array controller operations can be monitored or communicated by the array controller and monitored by the user interface and the user. The user can issue commands to access the status registers at any time to determine the state of the array controller. For example, prior to issuing a command to the memory system, it is preferred that the state of the array controller is such that the command to be issued will be accepted as a valid command. The state of the array controller can be determined by reading the status registers 260.

Figure 5:
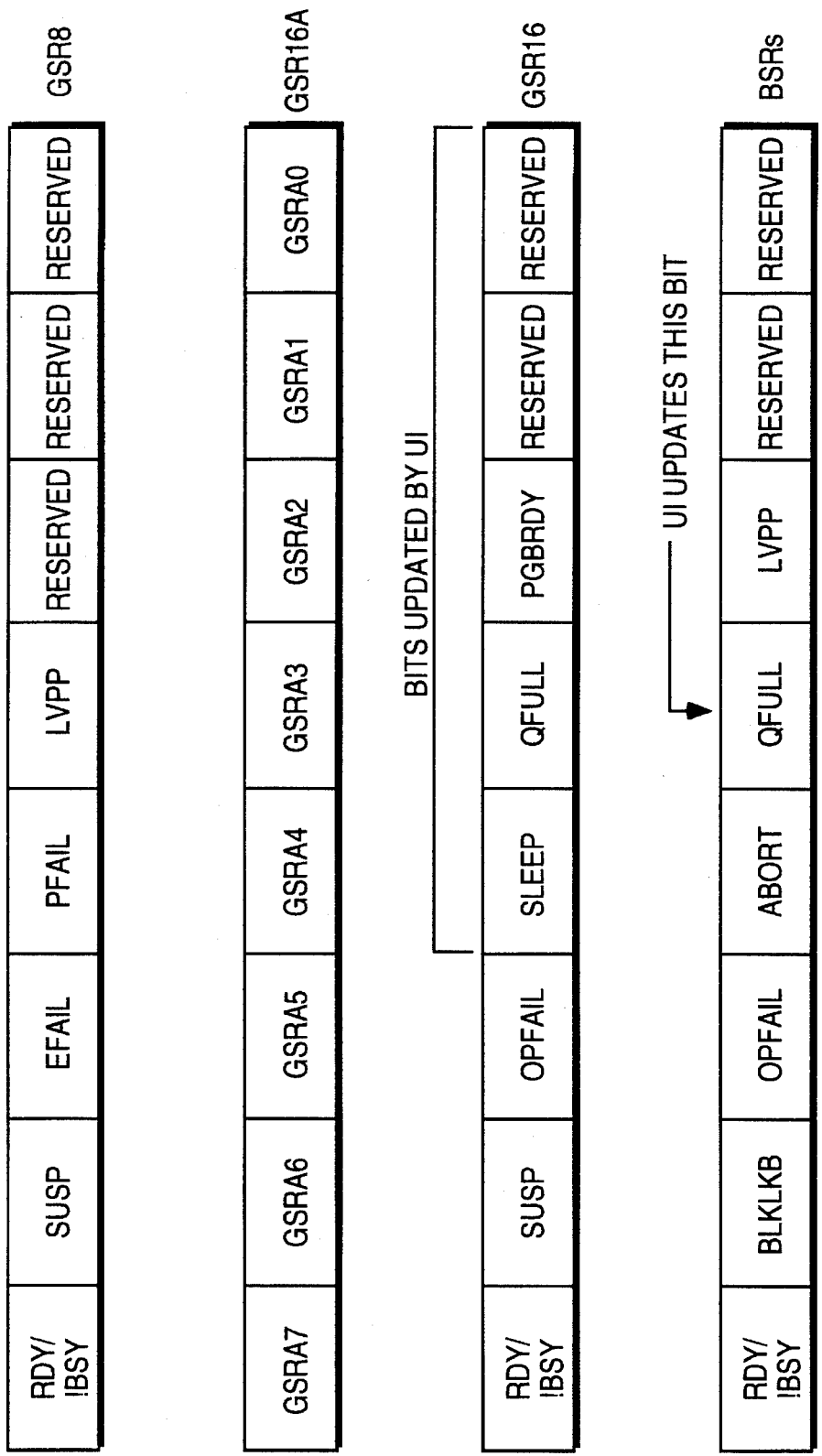
FIG. 5 is a block diagram illustration of exemplary status register bit definitions.

Preferably three global status registers and a set of 32 block status registers (BSRs) are provided. FIG. 5 is a block diagram illustration of exemplary status register bit definitions. The global status registers provide the status of the device in general and do not convey any block specific information. Although, for example, a failed operation can be detected in the global status registers, the actual block which the failed operation occurred can only be detected by reading the BSRs. The first global status register is preferably configured to be backwards compatible with earlier memory products. The second global status register provides information regarding the state of the array controller, the status of the operation queue and the status of the page buffer. The third global status register contains 8 nondedicated bits which can be manipulated by the array controller. The definition of its bits is dependent upon the algorithms implemented on the array controller. Thus, the user can issue commands and monitor the third global status register to determine the state of execution by the array controller for a specific algorithm. The ability to monitor the state of the array controller through the status registers enables the user to determine valid commands before issuing subsequent commands to the memory system.

Figure 6A:
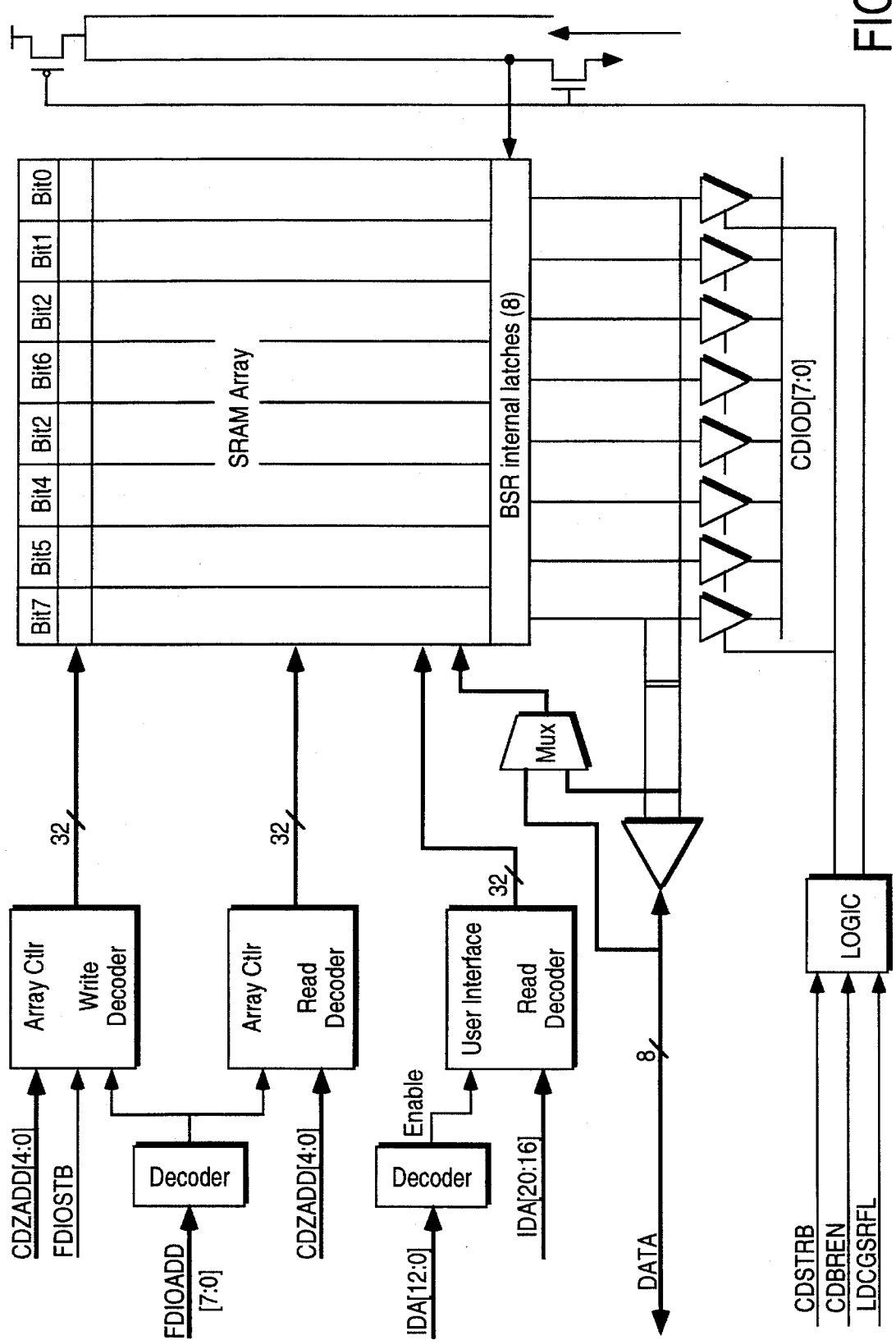

The block status registers (BSRs) are used to hold the status of operations performed upon the blocks of the array. An illustrative block diagram is shown in FIG. 6a. As shown in FIG. 6a, it is preferred that the BSRs are configured as a 32×8 single port write, dual port read SRAM array. The write port of the SRAM is connected to the array controller write decoder. A read decoder is provided for the array controller and user interface. Thus, the array controller can write to and read from the BSRs located in the SRAM array, but the user interface can only read from the array. The user can read the BSR by issuing such a request to the user interface which provides signals (for example, IDA[12:0], IDA[20:16] with the address, and OEBPAD) which select one BSR and provide the contents of the BSR on the I/O status register bus to the user interface. The status information is then provided to the user. FIG. 6b show an exemplary configuration for the bits of the BSRs as the BSRs are configured in a SRAM array, the definition of the bits are programmable, providing additional flexibility in the operation of the system.

Each BSR includes a lock bit which provides a mechanism for write protection of the corresponding blocks of the flash array. To protect a block from inadvertent erase or program operations, the non-volatile lock bit in the BSR associated with that particular block is set. Once the lock bit has been set for the particular block, that block is protected from erase or write operations. Lock bits are located in each array block and are erased every time the associated block is erased. The status of the lock bit is read by the user by reading the corresponding bit in the BSR.

As noted above, the array controller is a programmable micro-controller used to control the internal modes of the flash device. More particularly, the array controller provides a means to automatically and precisely control the algorithms which includes algorithms to program and erase cells in the flash array. The array controller is accessed through the user interface which controls the initiation of the array controller operations. The array controller operates on a two clock cycle per operation basis. Preferably the clock cycles for preparation for execution of operation N occur during the execute clock cycle of operation N-1. In this manner, the array operations execute in one cycle and the only delay occurs prior to execution of the first instruction. Within a clock cycle, instruction execution is broken into three phases. This partitioning provides sufficient clock edges for an I/O bus cycle to occur during one clock cycle.

Figure 7:
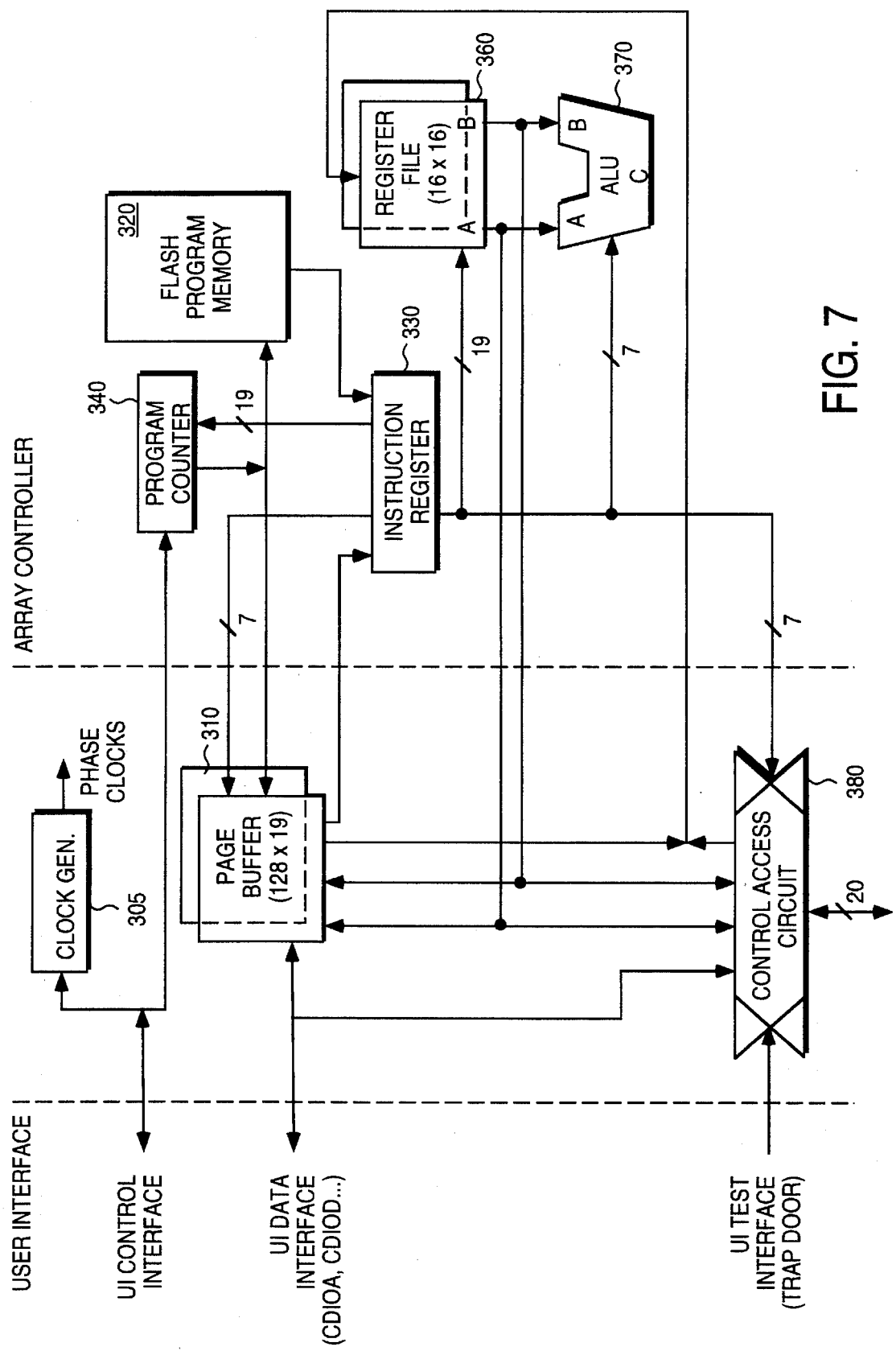
FIG. 7 is a block diagram of the array controller utilized in the nonvolatile memory of the present invention.

Referring to FIG. 7, the array controller executes algorithms which are stored in the flash program memory 320. These algorithms comprise instruction words, particularly data transfer instructions, computational instructions, branching instructions and control instructions. Data transfer instructions relate to moving 8-bit or 16-bit data to and from the register file 360. Branching instructions allow programming to modify the flow of an algorithm through the use of subroutine calls and conditional/unconditional jumps. Computational instructions result in operations that involve the arithmetic logic unit 370. Control instructions provide the means for setting or clearing flags and setting pointers to the interrupt handling routines.

The control access circuit 380 located between the user interface and the array controller provides the means by which the array controller receives instructions to execute algorithms and communicates status information to the user interface and ultimately the user. For example, in the preferred embodiment, the user interface provides three signals, CDRUNF, which informs the array controller that there are algorithms waiting to be executed, CDCMDRDY, which indicates that in addition to the current algorithm there is at least one more algorithm awaiting execution, and CDSUS-REQ, which informs the array controller that there is a request to suspend the array controller execution pending. In return the array controller communicates to the user interface a signal FDRDY to indicate whether or not the array controller has control of the device and is running, FDNX-TCMD to indicate whether the array controller is executing the command located in the primary queue or an interrupting command located in a secondary queue, FDOPDONE to indicate that the operation currently being serviced has completed and FDIDLE to indicate that operations have successfully been suspended and the user may take control of the memory device to perform an operation such as a read operation.

As noted earlier, the user interface is driven by the microprocessor bus signals while the array controller is driven by the oscillator located in the flash system. In particular, the oscillator phase generator block 305 generates 3 non-overlapping clock pulses to be used as discrete clock signals for the array controller circuitry. The oscillator 305 is initiated by the user interface when a command from the user interface is to be executed.

The program memory 320 stores the algorithms that are accessed according to the jump vectors received from the user interface and the program addresses stored in the first 32 addresses of program memory and are executed by the array controller to perform the functions requested. The benefits realized by providing a programmable array controller are enormous. The algorithms can be configured to the requirements of the application the flash system is providing. For example, the algorithms for standard program and erase processes as well as custom processes which perform variations on the program and erase processes can be included in the program memory and accessed by issuing the corresponding command. Furthermore, the user, through commands issued to the user interface, can modify the functionality of the array controller by modification of the algorithms stored in the program memory. This is quite different from prior art devices which required modification of the hardware in order to change the algorithms. Preferably, the program memory is modified by the array controller as controlled by the user interface circuit. As the program memory itself is being modified, the page buffer is loaded with the programming algorithm and the array controller references the page buffer for the algorithm to program the program memory.

The flexibility provided by the architecture of the flash memory system of the present invention is quite extensive. For example, if an application required that an index be provided to point to specific data stored in the flash array, the prior systems utilized an external memory such as SRAM, to store and access the pointers in order to determine where to access data in the flash array. However, the flash system of the present invention permits the array controller to store the pointers and perform the search using the pointers, eliminating the need for external SRAM and also increasing the throughput of the operations as each array can perform the operation in parallel. Thus, parallel processing of the flash for arrays is achieved. Another application made viable by the flash memory system of the present invention is the use of the flash memory to replace film in cameras. In order to render this application effective, high speed writing of the image data is required. Typically, if an error is incurred, another attempt of the writing operation is performed. However, in this application, speed is of the essence and it is faster just to mark the block as bad. The flash memory system of the present invention can accommodate this application by simply generating program code to perform the write function and storing the code in the flash array code storage. Thus, customization is possible and quite simple to implement.

To execute the algorithms, the array controller is embodied as a general purpose processing structure, consisting of an instruction register 330, which stores the current instruction, a program counter 340, a call stack 345 arithmetic logic unit (ALU) 370, and register file 360 which used as a scratch memory by the ALU 370 during execution is utilized.

Figure 8:
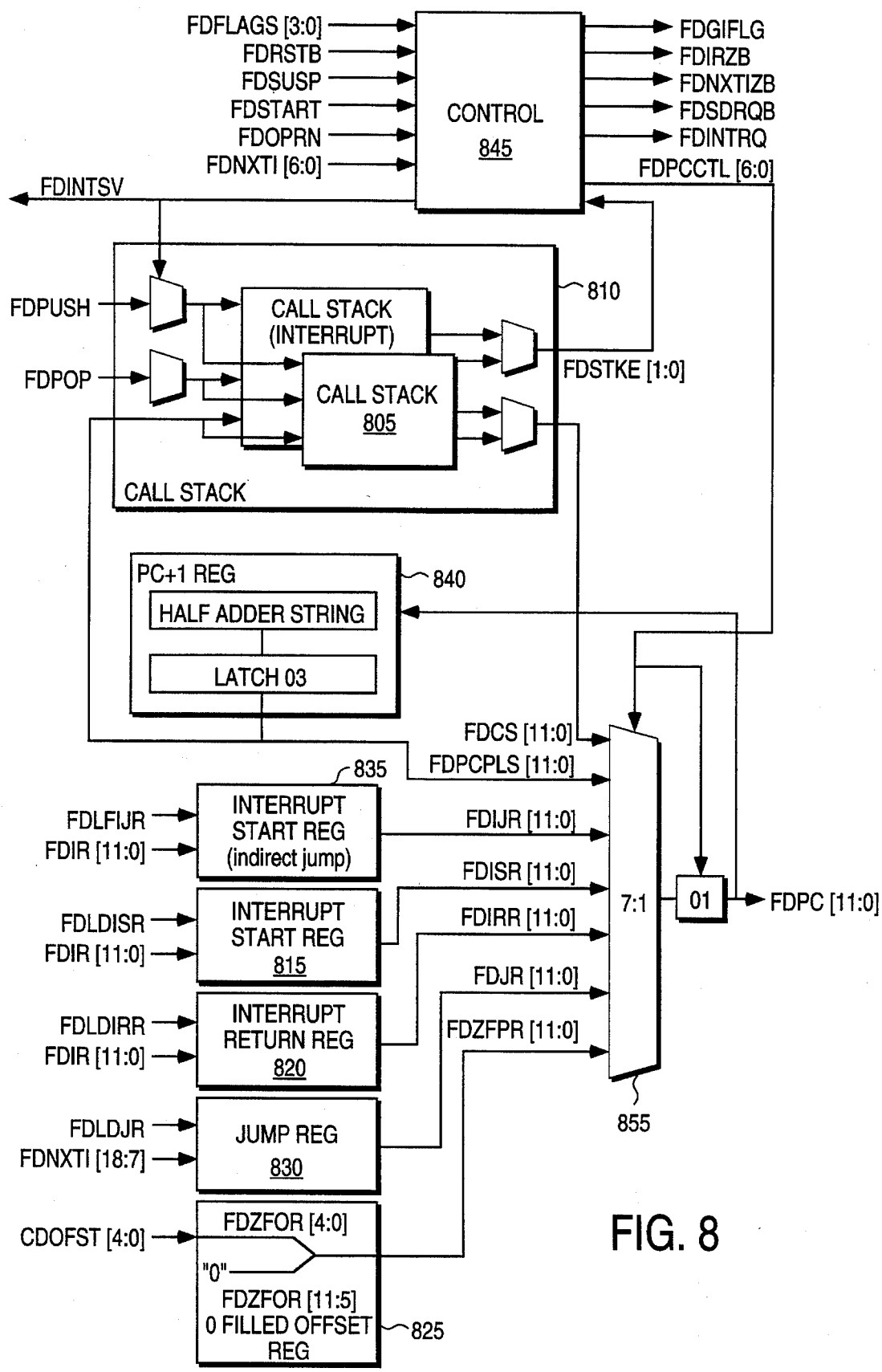
FIG. 8 is a block diagram illustration of the program counter circuit.

The program counter 340 contains all the pointer storage and logic to maintain proper cycling of the instructions given to the array controller. Furthermore, this structure provides for an innovative context switching and interrupt structure. The basic operation of the program counter is to decode the next instruction to be executed and point to the proper instruction to follow (FDPC[11:0]). The address provided as output of the program counter is used to retrieve the next instruction from program memory for transfer to the instruction register and execution by the ALU. Referring to FIG. 8, the program counter consists of two stacks, call 805, call interrupt 810; five registers, interrupt start 815, interrupt return 820, zero fill 825, offset jump 830, indirect jump 835; and one register adder 840. Control circuitry 845 performs a plurality of control functions including control of multiplexor 855 to select the source of the address output from the various sources, 835, 815, 820, 825, 830, 840, 805, arbitration between next instruction jump location algorithm, offset starting points, hardware interrupts and software returns. The call stacks 805 comprise 12-bit wide push-up, pop-down full stacks.

This architecture allows the array controller to perform a context switch during an interrupt to save the array controller's context in a timely manner so that after an interrupt operation is complete, a context switch can be performed to restore the original state of the array controller and the original operation can continue. Each stack, 805 and 810, consists of latches which are surrounded by logic (not shown) to provide stack-like behavior. Preferably, the push and pop logic are state machines which decode the next address to point to after a push or pop operation takes place.

Referring back to FIG. 7, the program memory 320 receives the address determined by the program counter 340 and outputs the instruction to the instruction register 350 which latches the instruction output. For further flexibility in operation, the instruction register 330 also has the ability to latch an instruction received through the page buffer 310. The instruction is then executed by the ALU 370. The ALU 370 performs all arithmetic and logic functions as well as shift operations for the array controller. It is capable of handling both byte and word operations. The instruction to execute is obtained from the program memory 320 via the instruction register 350. The input data to the ALU can originate from multiple sources including the page buffer and the I/O interface.

The register file 360 is constructed as a three port SRAM for permitting the array controller to read from two ports while writing to the register file through a third port. Each of the two read ports and a single write port operate independently of each other and may actually be operating on the same memory location. The timing is such that a read operation occurs during phase one of the clock, a write operation occurs during phase three of the clock, thereby, allowing phase two to be used as a computational phase. The register file can therefore be read and updated in one clock cycle. The register file contains the state of the array controller; particularly the variables utilized during execution of the array controller algorithm.

The register file 360 is partitioned into two sections. The first section, identified as the main section, contains the variables for the algorithm executed by the array controller. The second section contains the variables for an interrupting algorithm. Therefore, when servicing an interrupt, the register file can perform the hardware context switch of the state of the array controller from the main section to the second section. All operations are now performed in the interrupt section of the register file which appears to be the same as the main section. All variables held in the main section of the register file will be maintained but not accessible during interrupt servicing. After the interrupt service, control is given to the main section again.

The present architecture supports a four level deep program counter stack. This allows the algorithms written for the memory device to be more modular in operation. For example, the return instruction serves dual duty in conjunction with the program counter stack. When there is data in the program counter stack, the return instruction serves to return from a called subroutine. If the PC stack is empty, the instruction serves as the algorithm termination instruction. This allows user algorithms to be terminated with a return instruction so that for normal operation, the array controller will halt execution, but for test operations such as cycling, the user algorithms can be called as if they were subroutines.

The architecture of the flash memory system of the present invention provides an innovative interrupt mechanism which permits interrupts of array controller algorithms without corruption of data or the high voltage program/erase circuits. Unlike prior art devices, the interrupt mechanism provides a way to protect the memory device before servicing the interrupt by taking it out of a state which may be damaging to the array. For example, if the array controller is currently controlling an erase process, the voltages required to erase the array are powered down to avoid damaging the memory. After servicing the interrupt, the memory device and array controller are placed back into a state from which the original executing process can continue, such as an erase pulse.

In particular, the innovative interrupt mechanism provides for the safe interrupt and suspension of the currently executing algorithm by first executing interrupt start code associated with the currently executing algorithm. This interrupt start code safely suspends the currently executing algorithm. For example, the interrupt start code determines a safe point in the algorithm to suspend, powering down high voltage circuits being utilized, placing the read/write circuitry in a state for use by the interrupting algorithm, and performing the context switch of registers necessary. Once the interrupt start routine has completed execution, the interrupting routine begins execution and, at the end of execution of the interrupting routine, an interrupt return routine is executed to adjust the program counter to point to a safe return point in the interrupted code and perform a context switch of registers such that the interrupted routine can continue execution.

Using the innovative interrupt processing provided in the flash circuitry of the present invention, support of program while erase algorithms and other algorithm suspension features are possible. For example, the interrupt structure permits interrupts to occur during concurrently executing algorithms. Furthermore, the interrupt structure, operation queue and status registers function as an innovative virtual state machine to provide for multiprocessing-like capability.

Preferably the interrupt handling is controlled by three instructions issued by the state machine of the user interface, enable interrupts (ENI), disable interrupts (DSI) and set interrupt start register (SISR). ENI takes a safe return point to the algorithm as an argument, sets the interrupt return register (IRR) to this value and sets the interrupt enable flag (IF). DSI takes no arguments and simply resets the IF. SISR takes the address of the interrupt start routine address as an argument and sets the interrupt start register (ISR). To ensure PC stack integrity, the IRR address must reside in the procedure that was interrupted. Thus, for example, if the signal CDCMDRDY indicates a command awaiting execution and the currently executing algorithm is interruptable, that is, the IF bit is set, a jump to the address stored in the ISR will occur on the first instruction cycle after CDCMDRDY is set. Immediately, the interrupt request signal is asserted and IF is cleared. Upon completion of the interrupt start routines, signified by return (RET) instruction, the interrupt acknowledge signal and start signal are asserted. The interrupt algorithm is then executed. Upon completion of the interrupt algorithm signified by RET instruction on an empty PC stack, the interrupt bit is cleared and a jump to the address stored in the IRR occurs. The interrupted algorithm then continues executing.

The interrupt return routine including the return address and interrupt start routine are predetermined. Preferably at the time the array controller algorithm is created and loaded into the program memory, the interrupt start routine and return routine are created and loaded into the program memory and the address of the interrupt start routine and return routine are determined. When an algorithm is executed, the IRR and ISR are loaded into the program counter such that when an interrupt occurs, the information is readily available and the starting addresses of the interrupt start and return routines are timely utilized to access the appropriate addresses in program memory for loading in the instruction register and for execution by the ALU.

Figure 9A:
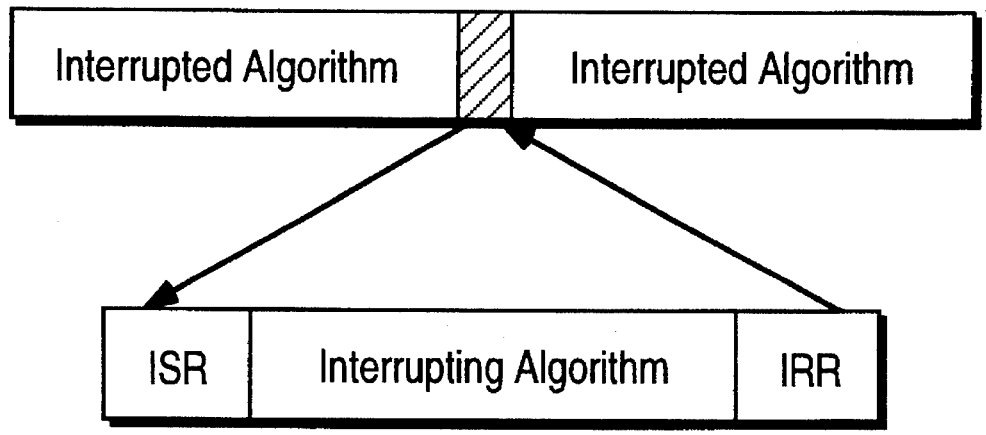
FIGS. 9a and 9b illustrate the flow of the interrupt process of the present invention.

Thus, if an interruptable algorithm is executing and an interrupt occurs, control is immediately passed to the interrupt start routine for that algorithm. The interrupt start routine places the array controller in a state to permit the interrupting algorithm to execute and the interrupted algorithm to be subsequently executed to completion. Thus, the interrupt start routine determines whether the interrupt can be performed at this point and if it can be performed, places the flash high voltage and read circuits in a known, safe state. The array controller then performs a context switch of the call stack an register file to access alternate copies, thereby performing a context switch. Upon completion of the interrupting algorithm, control is passed to the interrupt return routine. When this transition takes place, the call stack and register file are switched back to the ones used by the interrupted algorithm. The interrupt return routine is responsible for placing the device's high voltage and read circuits in the proper state to continue execution of the interrupted algorithm and provide the address of the interrupted algorithm which is a safe point to begin execution. At this point, execution of the interrupted algorithm continues. This process flow is graphically depicted in FIG. 9a.

It should be noted that the point at which execution of the interrupted algorithm begins may not be at the same location the algorithm was interrupted. This is determined by the application. For example, if the interrupted algorithm is an erase array operation, the algorithm may be started after interrupt at a verify instruction in order that the last erase operation performed prior to interrupt is verified to have completed. Other criteria for determining the return point of an interrupted algorithm may be used as the algorithm's application dictates.

Furthermore, the address identifying the safe return point of the interrupted algorithm may be changed during execution of an algorithm as the algorithm executes different "phases" or sections of the algorithm. Therefore, the interrupt return point is updated during execution of the code to point to different return points. This may be accomplished by modifying the interrupt return routine or by updating the IRR to point to different interrupt return routines depending upon the location of execution in the algorithm. For example, in an erase algorithm, the return point for the precondition phase would be different than the return point for the erase portion of the algorithm which in turn would be different than the return point for the post-condition phase of the algorithm.

Preferably, two interrupt flags are provided in the array controller, an interrupt flag and a global interrupt flag. For an interrupt to occur, an operation must be pending and both flags must be enabled. The interrupt flag, which is initially in a disabled state, is used within an algorithm to locally enable and disable interrupts. Thus, an algorithm may have instructions for the array controller to enable and disable this flag during points of execution of the algorithm which are respectively interruptable and not interruptable. The interrupt flag is preferably automatically disabled when a call or return instruction is executed. This is done to ensure that IRR is pointing to the correct return for a particular subroutine.

Figure 9B:
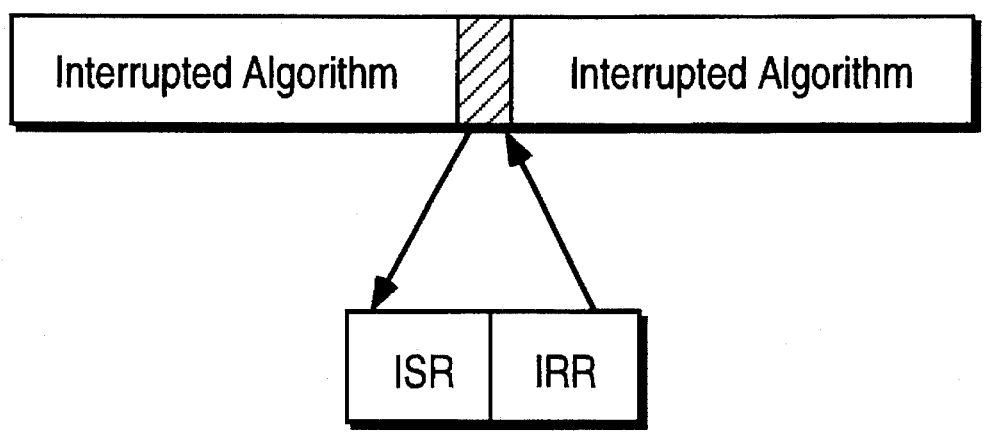

The Global Interrupt Flag which is initially enabled is used to disable interrupts when an algorithm cannot handle a pending interrupt. As shown in FIG. 9b, if an interrupt start routine for an interrupted algorithm determines that an interrupt cannot be processed at this time, the Global Interrupt Flag is disabled and a skip instruction to the interrupt return routine is executed.

The skip instruction can be viewed as a return instruction except that the instruction is executed while still in the interrupt start routine. The skip instruction causes the array controller to end the interrupt start routine and immediately execute the interrupt return routine, skipping execution of the interrupting algorithm. Thus, at completion of the interrupt return routine, if the Global Interrupt Flag is enabled, the interrupting algorithm has completed execution and can be removed from the operation queue. If the Global Interrupt Flag is disabled, the user interface leaves the operation pending in the operation queue so that it can be subsequently executed.

The structure therefore provides an interrupt mechanism which is conditional in nature and operates within a flash memory system without corruption or destruction of data in the array. Furthermore, the mechanism can easily accommodate level of priority for interrupts. For example, each algorithm can be identified by a priority level. The user interface circuit 40 loads the operation into the secondary queue and issues the signals necessary to request an interrupt and the currently executing process determines if the pending command request is of a higher priority. If it is, the interrupt is executed by the array controller by interrupting the executing operation (as noted by the information currently stored in the primary queue).

Figure 10A:
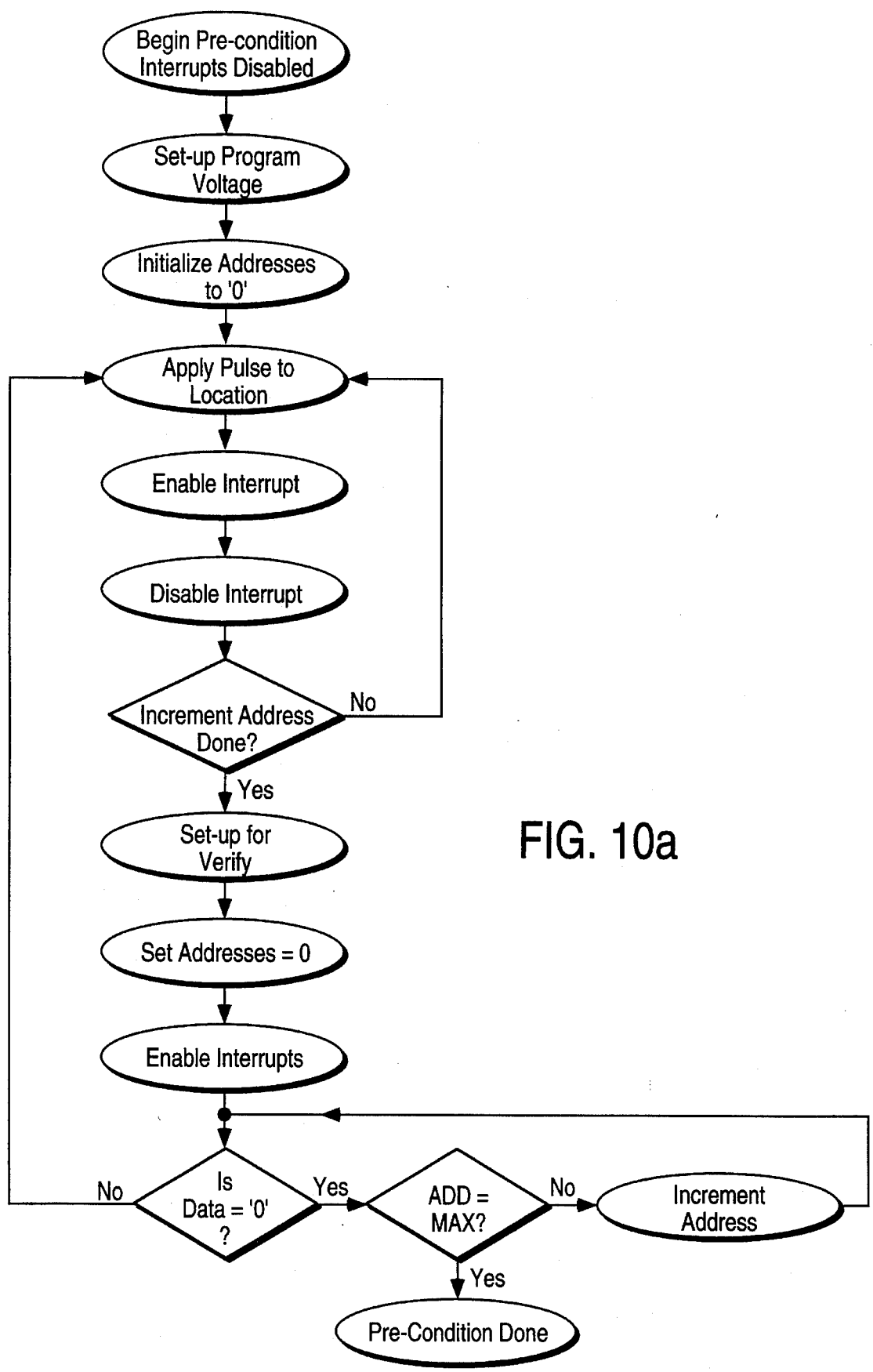
FIGS. 10a and 10b are flow diagrams illustrating the program during erase process in accordance with the teaching of the present invention.
Figure 10B:
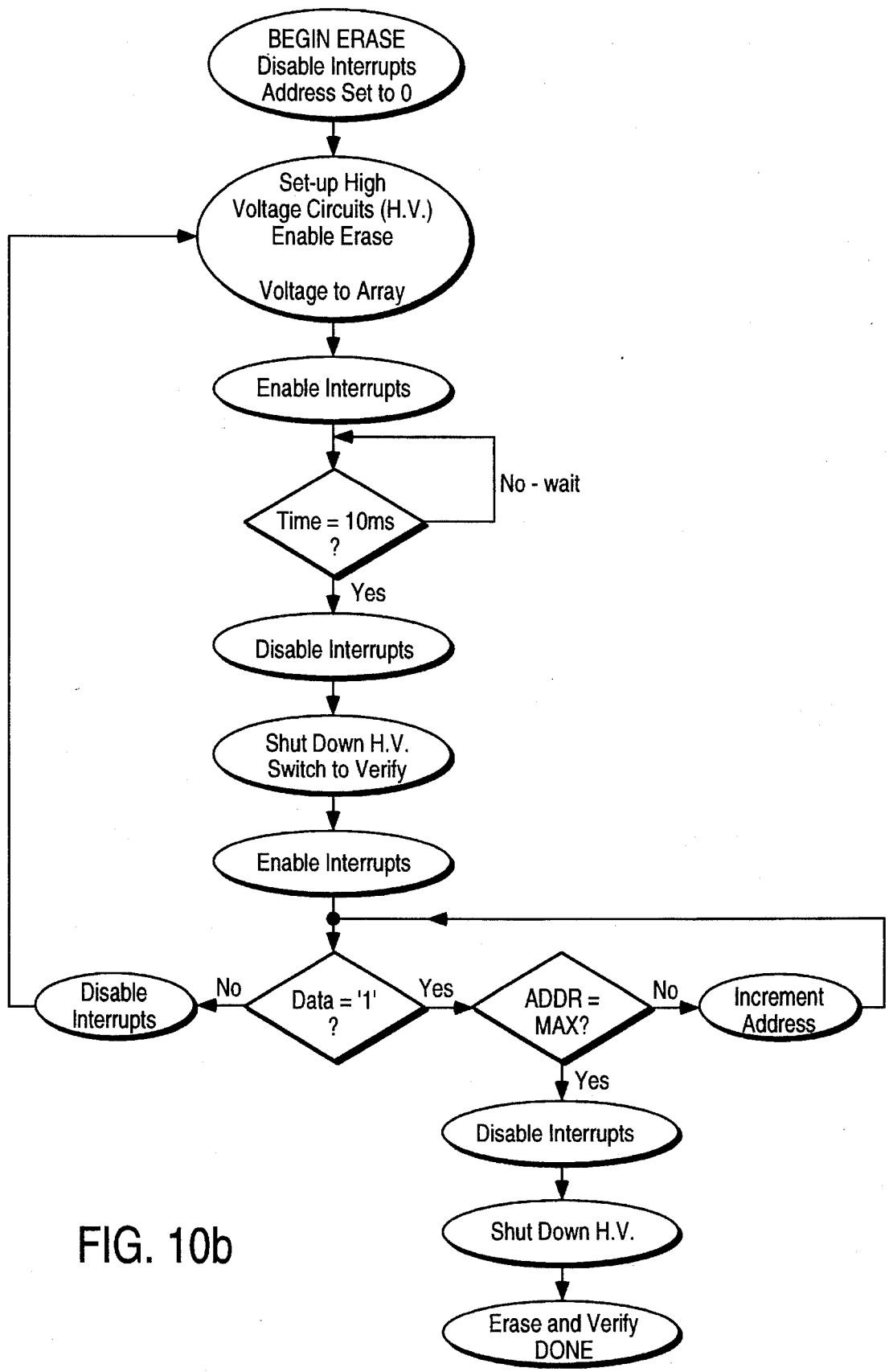

In addition, this structure permits a program while erase operation to occur. Erase operations on an array are a well known time consuming process. If an erase operation of a block is currently executing and a program operation of another block is awaiting execution, an interrupt is generated and the interrupt start routine check for the appropriateness of the interrupting algorithm (e.g., is it an attempt to program into an already erasing block?), and safely sequencing the internal power supplies to an off state prior to execution of the program algorithm. This is illustrated by the simplified flow diagram of FIGS. 10a and 10b. For purposes of explanation, the erase process can be described as composed of two major parts: the precondition process, in which all block data is programmed to "0"; and the verify process, in which the block data is set to a value of "1". As is shown in the process flow diagram, interrupts, caused by, for example, a request to program another block, are not permitted during high voltage circuitry manipulation, but are allowed during erase (e.g., see FIG. 10b).

The invention has been described in conjunction with the preferred embodiment. It is evident that numerous alternatives, modifications, variations and uses will be apparent to those skilled in the art in light of the foregoing description.

What is claimed is:

1. A flash memory array system fabricated on a single substrate and coupled to a processing device comprising:

an interrupt status bit, which when set, permits issuance of an interrupt during the execution of a command;

a user interface for receiving commands from the processing device to be executed by the flash memory, said user interface comprising a command queue having storage to store said received commands including a current command executing and logic for issuing an interrupt signal if the interrupt status bit is set and the command queue comprises the current command executing and a next command to be executed;

an array controller coupled to the user interface to receive operations to execute, said array controller controlling power sources to read, erase and program the memory array, said array controller coupled to receive the interrupt signal issued by the user interface;

at least one register coupled to the array controller to store a state of the array controller;

upon receipt of the interrupt signal, said array controller placing the memory array in a predetermined state, saving the state of the array controller, executing an operation corresponding to the next command, restoring the state of the array controller stored in the registers, and continuing execution of an operation corresponding to the current command;

such that interrupts can be processed by the flash memory system without corrupting the flash arrays.

2. A flash memory system fabricated on a single substrate and coupled to a processing device comprising:

a flash array comprising a plurality of flash cells for storage of data;

a user interface for receiving commands from the processing device to be executed by the flash memory system, said user interface comprising a command queue having storage to store said received commands and logic that generates a program memory address identifying the location of code in a program memory which, when executed, performs the command;

an array controller coupled to the user interface to receive the program memory address, said array controller comprising a micro-controller and the program memory, said program memory being programmable by a user to comprise code that is selectively executed by the microcontroller, said program memory address identifying the location of the code in program memory the micro-controller is to execute, said micro-controller performing operations with respect to the flash array in accordance with the code in program memory;

wherein the flash memory system can be programmed to perform a plurality of functions to be performed by the micro-controller, increasing the flexibility of the flash memory system and off loading control of the flash array from the processor device onto the micro-controller.

3. The system as set forth in claim 1, wherein said user interface further comprises a command state machine for receiving commands, said command state machine storing one or more commands in the command queue.

4. The system as set forth in claim 1, further comprising at least one algorithm which is executed by the array controller in response to an operation to execute.

5. The system as set forth in claim 4, wherein the algorithm indicates whether the algorithm can be interrupted.

6. The system as set forth in claim 4, wherein the algorithm comprises instructions to be executed, said algorithm including instructions to enable and disable interrupts such that during certain instructions interrupts are prohibited.

7. The system as set forth in claim 6, wherein said instructions comprise an enable interrupt instruction (ENI) which sets the interrupt status bit and identifies an instruction at which the operation corresponding to the current command is to continue execution after execution of the operation corresponding to the next command.

8. The system as set forth in claim 7, wherein said instructions comprises a disable interrupt instruction (DSI) which resets the interrupt status bit.

9. The system as set forth in claim 7, wherein said array controller further comprises an interrupt return register, said interrupt return register storing the identification of the instruction at which the operation corresponding to the current command is to continue execution after execution of the operation corresponding to the next command.

10. The system as set forth in claim 4, wherein the algorithm comprises interrupt start code, said interrupt start code executed when an interrupt is issued.

11. The system as set forth in claim 10, wherein said array controller further comprises an interrupt start register (ISR) and the algorithm comprises instructions to be executed, said instructions comprising a set interrupt start register instruction which when executed sets the interrupt start register to identify the location of the interrupt start code.

12. The system as set forth in claim 10, wherein said interrupt start code comprises instructions which are executed in response to an interrupt, said instructions identifying a point during execution of the operation at which the operation can be safely suspended without corrupting data.

13. The system as set forth in claim 10, wherein said interrupt start code comprises instructions which, when executed, place power sources and read/write circuitry in a state for use during execution of the operation corresponding to the next command.

14. The system as set forth in claim 10, wherein said interrupt start code comprises instructions which, when executed, performs a context switch of the state of the array controller with respect to the operations corresponding to the current command and the next command.

15. The system as set forth in claim 4, wherein the algorithm comprises interrupt return code, said interrupt return code executed at the completion of execution of the operation corresponding to the next command.

16. The system as set forth in claim 15, wherein said interrupt return code causes execution of the operation corresponding to the current command to continue at a safe return point in the operation corresponding to the interrupted current command.

17. The system as set forth in claim 15, wherein said array controller further comprises a program counter which points to an instruction to be executed, said interrupt return code adjusting the program counter to point to an instruction at which to continue execution of the operation corresponding to the current command.

18. The system as set forth in claim 15, wherein said interrupt return code comprises instructions which, when executed, place power sources and read/write circuitry in a state for use during execution of the operation corresponding to the current command.

19. The system as set forth in claim 16, wherein safe return point varies according to the state of execution of the current process when an interrupt is issued.

20. The system as set forth in claim 4, wherein the algorithm determines whether the next command is of a higher priority to interrupt the current command.

21. The system as set forth in claim 1, wherein the current command comprises a command to erase at least a portion of the flash memory array and the next command comprises a command to program at least a portion of the flash memory array, said flash memory system performing a program during erase operation.

22. The system as set forth in claim 1, wherein the user interface comprises a plurality of block status registers indicating a status of the corresponding block, at least one register allocated to each block of the flash memory array, said system executing the current command on a first set comprising at least one block of the flash memory array and executing the next command on a second set comprising at least one block of the flash memory array, said execution of the current command causing the update of corresponding block status registers, said execution of the next command causing the update of the corresponding block status registers, wherein the issuance of the interrupt and the execution of the next command prior to completion of the current command and the corresponding update of the block status registers provides for multiple process execution by a single array controller.

23. The system as set forth in claim 2, wherein said user interface further comprises a command state machine, said command state machine receiving commands to be executed and initiating the array controller to receive the program memory address and execute code to perform the command.

24. The system as set forth in claim 2, said user interface further comprising a jump table identifying an offset vector for each command to be executed by the array controller into the program memory of the array controller, said offset vector indicating the location of code to be executed in response to the command.

25. The system as set forth in claim 24, wherein the offset vector points to an index location in the program memory, said index location identifying the first address of the code to be executed from the program memory by the array controller.

26. The system as set forth in claim 25, wherein the jump table is configured to map multiple commands to a single offset vector to permit multiple classes of commands, distinguished by the hardware configuration of the flash memory system, to utilize the same code, thereby supporting multiple hardware configurations without modification of the user interface or array controller.

27. The system as set forth in claim 26, wherein the user interface generates at least one hardware configuration signal to the array controller in conjunction with the transmission of the offset vector to identify different hardware configurations.

28. The system as set forth in claim 25, wherein code executed in response to a command can be changed by modifying the starting address stored in the index location to reference a different portion of the program memory.

29. The system as set forth in claim 2, wherein said system further comprising at least one page buffer for receiving and temporarily storing code to be executed by the array controller to perform an update of the program memory, such that if a command is received by the user interface to update the program memory, said user interface causing the array controller to execute the code temporarily stored in the page buffer to update the program memory, wherein the code executed pursuant to a specific command can be modified or code corresponding to additional commands can be added.

30. The system as set forth in claim 2, wherein said commands comprise commands to program and erase the flash array.

31. A system comprising:
a processor for issuing commands;
a bus coupled to the processor;
a flash memory array system fabricated on a single substrate and coupled to the bus comprising;
 a flash memory array;
 an interrupt status bit, which when set, permits issuance of an interrupt during the execution of a command;
 a user interface for receiving commands from the processor to be executed by a flash memory array system, said user interface comprising a command queue having storage to store said received commands including the current command executing and logic for issuing an interrupt signal if the interrupt status bit is set and the command queue comprises the current command executing and a next command to be executed;
 an array controller coupled to the user interface to receive operations to execute, said array controller controlling power sources to read, erase and program the flash memory array, said array controller coupled to receive the interrupt signal issued by the user interface;
 at least one register coupled to the array controller to store a state of the array controller;
 upon receipt of the interrupt signal, said array controller placing the flash memory array in a predetermined state, saving the state of the array controller, executing an operation corresponding to the next command, restoring the state of the array controller stored in the registers, and continuing execution of an operation corresponding to the current command;
 such that interrupts can be processed by the flash memory system without corrupting the flash memory arrays.

32. The system as set forth in claim 31, wherein said user interface further comprises a command state machine for receiving commands issued by the processor, said command state machine storing one or more commands in the command queue.

33. The system as set forth in claim 31, further comprising at least one algorithm which is executed by the array controller in response to an operation to execute.

34. The system as set forth in claim 33, wherein the algorithm indicates whether the algorithm can be interrupted to execute the operation corresponding to the next command received from the processor.

35. The system as set forth in claim 34, wherein the algorithm comprises instructions to be executed, said instructions including instructions to enable and disable interrupts such that during execution of certain instructions interrupts are prohibited.

36. The system as set forth in claim 35, wherein said instructions comprise an enable interrupt instruction (ENI) which sets the interrupt status bit and identifies an instruction at which the operation corresponding to the current command is to continue execution after execution of the operation corresponding to the next command.

37. The system as set forth in claim 35, wherein said instructions comprises a disable interrupt instruction (DSI) which resets the interrupt status bit.

38. The system as set forth in claim 35, wherein said array controller further comprises an interrupt return register, said interrupt return register storing the identification of the instruction at which the operation corresponding to the current command is to continue execution after execution of the operation corresponding to the next command.

39. The system as set forth in claim 33, wherein the algorithm comprises interrupt start code, said interrupt start code executed when an interrupt is issued.

40. The system as set forth in claim 39, wherein said array controller further comprises an interrupt start register (ISR) and the algorithm comprises instructions to be executed, said instructions comprising a set interrupt start register instruction which when executed sets the interrupt start register to identify the location of the interrupt start code.

41. The system as set forth in claim 39, wherein said interrupt start code comprises instructions which are executed in response to an interrupt, said instructions identifying a point during execution of the operation corresponding to the command at which the operation corresponding to the command can be safely suspended without corrupting data.

42. The system as set forth in claim 39, wherein said interrupt start code comprises instructions which, when executed, place power sources and read/write circuitry in a state for use during execution of the operation corresponding to the next command.

43. The system as set forth in claim 39, wherein said interrupt start code comprises instructions which, when executed, performs a context switch of the state of the array controller with respect to the operation corresponding to the current command and the operation corresponding to the next command.

44. The system as set forth in claim 33, wherein the algorithm comprises interrupt return code, said interrupt return code executed at the completion of execution of the operation corresponding to the next command.

45. The system as set forth in claim 44, wherein said interrupt return code causes execution of the operation corresponding to the current command to continue at a safe return point in the operation corresponding to the interrupted current command.

46. The system as set forth in claim 43, wherein said array controller further comprises a program counter which points to an instruction to be executed, said interrupt return code adjusting the program counter to point to an instruction at which to continue execution of the operation corresponding to the current command.

47. The system as set forth in claim 44, wherein said interrupt return code comprises instructions which, when executed, place power sources and read/write circuitry in a state for use during execution of the operation corresponding to the current command.

48. The system as set forth in claim 45, wherein safe return point varies according to the state of execution of the current process when an interrupt is issued.

49. The system as set forth in claim 33, wherein the algorithm determines whether the next command is of a higher priority to interrupt the current command.

50. The system as set forth in claim 31, wherein the current command comprises a command to erase at least a portion of the flash memory array and the next command comprises a command to program at least a portion of the flash memory array, said flash memory system performing a program during erase operation.

51. The system as set forth in claim 31, wherein the user interface comprises a plurality of block status registers indicating a status of a corresponding block, at least one register allocated to each block of the flash memory array, said system executing the current command on a first set comprising at least one block of the flash memory array and executing the next command on a second set comprising at least one block of the flash memory array, said execution of the current command causing the update of corresponding block status registers, said execution of the next command causing the update of the corresponding block status registers, wherein the issuance of the interrupt and the execution of the next command prior to completion of the current command and the corresponding update of the block status registers provides for multiple process execution by a single array controller.

52. A flash memory array system fabricated on a single substrate and coupled to a processing means comprising:

an interrupt status means, which when set, permits issuance of an interrupt during the execution of a command;

receiving means coupled to the processing means for receiving from the processing means commands to be executed by the flash memory and having storage to store the received commands including the current command executing and means for issuing an interrupt signal if the interrupt status means is set and the storage comprises the current command executing and a next command to be executed;

executing means coupled to the receiving means to receive operations to execute, said executing means controlling power sources to read, erase and program the flash memory array, said executing means coupled to receive the interrupt signal issued by the receiving means;

storage means coupled to the executing means to store a state of the executing means;

upon receipt of the interrupt signal, said executing means placing the flash memory array in a predetermined state, saving the state of the executing means, executing operations corresponding to the next command, restoring the state of the array controller stored in the storage means, and continuing execution of operations corresponding to the current command;

such that interrupts can be processed by the flash memory system without corrupting the flash memory arrays.

53. The system as set forth in claim 52, further comprising at least one algorithm which is executed by the executing means in response to an operation to execute.

54. The system as set forth in claim 53, wherein the algorithm indicates whether the algorithm can be interrupted.

55. The system as set forth in claim 53, wherein the algorithm comprises instructions to be executed, said code including instructions to enable and disable interrupts such that during certain instructions interrupts are prohibited.

56. The system as set forth in claim 55, wherein said instructions comprise an enable interrupt instruction (ENI) which sets the interrupt status means and identifies an instruction at which the operation corresponding to the current command is to continue execution after execution of the operation corresponding to the next command.

57. The system as set forth in claim 56, wherein said instructions comprises a disable interrupt instruction (DSI) which resets the interrupt status means.

58. The system as set forth in claim 56, wherein said array controller further comprises an interrupt return register, said interrupt return register storing the identification of the instruction at which the operation corresponding to the current command is to continue execution after execution of the operation corresponding to the next command.

59. The system as set forth in claim 53, wherein the algorithm comprises interrupt start code, said interrupt start code executed when an interrupt is issued.

60. The system as set forth in claim 59, further comprising a means for identifying the location of the interrupt start code and an algorithm comprising an instruction which, when executed, sets the means to identify the location of the interrupt start code.

61. The system as set forth in claim 59, wherein said interrupt start code comprises instructions which are executed in response to an interrupt, said instructions identifying a point during execution of the operation corresponding to the command at which the operation can be safely suspended without corrupting data.

62. The system as set forth in claim 59, wherein said interrupt start code comprises instructions which, when executed, place power sources and read/write circuitry for the flash memory array in a state for use during execution of the operation corresponding to the next command.

63. The system as set forth in claim 59, wherein said interrupt start code comprises instructions which, when executed, performs a context switch of the state of the array controller with respect to the operation corresponding to the current command and the operation corresponding to the next command.

64. The system as set forth in claim 53, wherein an algorithm comprises interrupt return code, said interrupt return code executed at the completion of execution of the operation corresponding to the next command.

65. The system as set forth in claim 54, wherein said interrupt return code causes execution of the operation corresponding to the current command to continue at a safe return point in the interrupted operation corresponding to the current command.

66. The system as set forth in claim 64, wherein said interrupt return code comprises instructions which, when executed, place power sources and read/write circuitry in a state for use during execution of the operation corresponding to the current command.

67. The system as set forth in claim 65, wherein the safe return point varies according to the state of execution of the current process when an interrupt is issued.

68. The system as set forth in claim 53, wherein the algorithm determines whether the operation corresponding to the next command is of a higher priority to interrupt the current command.

69. The system as set forth in claim 52, wherein the current command comprises a command to erase at least a portion of the flash memory array and the next command comprises a command to program at least a portion of the flash memory array, said flash memory system performing a program during erase operation.

70. The system as set forth in claim 52, further comprising a means for storing a status of blocks of the flash memory array, said executing means executing the current command on at a first set of blocks of the flash memory array comprising at least one block and executing the next command on a second set of blocks of the flash memory array comprising at least one block, said execution of the current command causing the update of the means for storing the status of blocks, said execution of the next command causing the update of the means for storing a status of blocks, wherein the issuance of the interrupt and the execution of the next command prior to completion of the current command and the update of the means for storing a status of blocks provides for multiple process execution by a single array controller.

71. In a flash memory array system coupled to a processing device, said system comprising at least one flash memory array, a command queue and an array controller for performing operations on the array, a method performed by the flash memory system for processing interrupts of execution of operations on the flash memory array without corrupting the flash memory array, said method comprising the steps of:

receiving from the processing device commands to be executed by the flash memory array system;

executing a current command to perform operations on the flash memory array;

storing the received commands in said command queue having storage to store the received of commands including the current command executing;

providing interrupt status, which when set to a first state, permits issuance of an interrupt during the execution of a command;

if the interrupt status is set and the command queue comprises the current command executing and a next command to be executed, saving the state of the array controller in at least one register, executing the next command, restoring the state of the array controller stored in the register, and continuing execution of the current command;

such that interrupts can be processed by the flash memory system without intervention from the processing device and without corrupting the flash arrays.

72. The method as set forth in claim 71, further comprising the step of providing at least one algorithm comprising instructions which are executed when executing a command.

73. The method as set forth in claim 72, further comprising the step of determining whether the current command executing can be interrupted.

74. The method as set forth in claim 73, wherein the step of determining comprises the steps of executing instructions to enable interrupts and executing instructions to disable interrupts during execution of the command such that interrupt during execution of certain instructions are prohibited.

75. The method as set forth in claim 74, wherein said step of executing instructions to enable interrupts comprises the steps of setting the interrupt status and identifying an instruction in the algorithm at which to continue execution of the current command after execution of the next command.

76. The method as set forth in claim. 71, further comprising the step of identifying a point during execution of the current command at which the current command can be safely suspended without corrupting data if the interrupt status is set and the command queue comprises the current command executing and a next command to be executed.

77. The method as set forth in claim 71, further comprising the step of placing power sources and read/write circuitry in a state for use during execution of the next command if the interrupt status is set and the command queue comprises the current command executing and a next command to be executed.

78. The method as set forth in claim 72, wherein the step of continuing execution of the current command comprises the step of causing execution of the current command to continue at a safe return point in the interrupted current command.

79. The method as set forth in claim 72, further comprising the step of placing power sources and read/write circuitry in a state for use during execution of the current command prior to the step of continuing execution of the current command.

80. The method as set forth in claim 73, wherein the step of determining comprises the step of identifying whether the next command is of a higher priority to interrupt the current command.

81. The method as set forth in claim 71, wherein the step of executing the current command comprises the step of erasing at least a portion of the flash memory array and the step of executing the next command comprises the step of programming at least a portion of the flash memory array, such that said method performs a program during erase operation.

82. The method as set forth in claim 71, further comprising the step of providing a plurality of block status registers indicating a status of the corresponding block of the flash memory array, said step of executing the current command comprising the step of updating at least one corresponding block status register, said step of executing the next command comprising the step of updating at least one corresponding block status register, wherein the issuance of the interrupt and the execution of the next command prior to completion of the current command and the corresponding update of the block status registers provides for multiple process execution by a single array controller.

83. A system comprising:

a processor for issuing commands;

a bus coupled to the processor;

a flash memory system fabricated on a single substrate and coupled to the bus comprising:

a flash array comprising a plurality of flash cells for storage of data;

a user interface for receiving commands from the processor to be executed by the flash memory system, said user interface comprising a command queue having storage to store the received commands and logic that generates a program memory address identifying the location of code in a program memory which, when executed, performs the command;

an array controller coupled to the user interface to receive the program memory address, said array controller comprising a micro-controller and the program memory, said program memory being programmable by a user to comprise code that is selectively executed by the microcontroller, said program memory address identifying the location of the code in the program memory the micro-controller is the execute, said micro-controller performing operations with respect to the flash array in accordance with the code in program memory;

wherein the flash memory system can be programmed to perform a plurality of functions to be performed by the micro-controller, increasing the flexibility of the flash memory system and off loading control of the flash array from the processor onto the micro-controller.

84. The system as set forth in claim 83, wherein said user interface further comprises a command state machine, said command state machine receiving commands to be executed and initiating the array controller to receive the command address and execute code to perform the command issued by the processor.

85. The system as set forth in claim 83, said user interface further comprising a jump table identifying an offset vector for each command to be executed by the array controller into the program memory of the array controller, said offset vector indicating the location of code to be executed in response to the command issued by the processor.

86. The system as set forth in claim 85, wherein the offset vector points to an index location in the program memory, said index location identifying the first address of the code to be executed from the program memory by the array controller.

87. The system as set forth in claim 86, wherein the jump table is configured to map multiple commands to a single offset vector to permit multiple classes of commands, distinguished by the hardware configuration of the flash memory system, to utilize the same code, thereby supporting multiple hardware configurations without modification of the user interface or array controller.

88. The system as set forth in claim 87, wherein the user interface generates at least one hardware configuration signal to the array controller in conjunction with the transmission of the offset vector to identify different hardware configurations.

89. The system as set forth in claim 86, wherein code executed in response to a command can be changed by modifying the starting address stored in the index location to reference a different portion of the program memory.

90. The system as set forth in claim 83, wherein said system further comprising at least one page buffer for receiving and temporarily storing code to be executed by the array controller to perform an update of the program memory, such that if a command is received by the user interface to update the program memory, said user interface causing the array controller to execute the code temporarily stored in the page buffer to update the program memory, wherein the code executed pursuant to a specific command can be modified or code corresponding to additional commands can be added.

91. The system as set forth in claim 83, wherein said commands comprise commands to program and erase the flash array.

92. A flash memory system fabricated on a single substrate comprising:

a flash array comprising a plurality of flash cells for storage of data;

receiving means for receiving commands to be executed by the flash memory system;

command means for generating a program memory address identifying the location of code in a program memory means which, when executed, performs the command;

execution means coupled to receive the program memory address, said execution means comprising the program memory means, said program memory means being programmable by a user to comprise code that is selectively executed by the execution means, said program memory address identifying the location of the code in program memory means the execution means is to execute, said execution means performing operations with respect to the flash memory array in accordance with the code in program memory;

wherein the flash memory system can be programmed to perform a plurality of functions to be performed by the execution means, increasing the flexibility of the flash memory system and off loading control of the flash array onto the execution means.

93. The system as set forth in claim 92, wherein said receiving means further comprises a means for initiating the execution means to receive the program memory address and execute code to perform the command.

94. The system as set forth in claim 92, said command means further comprising a jump table identifying an offset vector for each command to be executed by the execution means into the program memory of the execution means, said offset vector indicating the location of code to be executed in response to the command.

95. The system as set forth in claim 94, wherein the offset vector points to an index location in the program memory, said index location identifying the starting address of the code to be executed from the program memory by the execution means.

96. The system as set forth in claim 95, wherein the jump table is configured to map multiple commands to a single offset vector to permit multiple classes of commands, distinguished by the hardware configuration of the flash memory system, to utilize the same code, thereby supporting multiple hardware configurations without modification of the flash memory system.

97. The system as set forth in claim 96, wherein the command means generates at least one hardware configuration signal to the execution means in conjunction with the transmission of the offset vector to identify different hardware configurations.

98. The system as set forth in claim 95, wherein code executed in response to a command can be changed by modifying the starting address stored in the index location to reference a different portion of the program memory.

99. The system as set forth in claim 92, wherein said system further comprises a memory means for receiving and temporarily storing code to be executed by the execution means to perform an update of the program memory, such that if a command is received by the receiving means to update the program memory, said command means causing the array controller to execute the code temporarily stored in the memory means to update the program memory, wherein the code executed pursuant to a specific command can be modified or code corresponding to additional commands can be added.

100. The system as set forth in claim 92, wherein said commands comprise commands to program and erase the flash array.

101. In a flash memory array system implemented as a single substrate comprising at least one flash memory array, logic and a command queue, a method performed by the flash memory array system for performing a plurality of programmable commands comprising the steps of:

receiving from a coupled processing device commands to be executed by the flash memory system;

providing a program memory comprising at least one section of code;

generating a program memory address in response to the command received identifying a location of code in program memory which, the code, when executed, performs a command received from the processing device; and executing the code starting at the location identified by the program memory address.

102. The method as set forth in claim 101, further comprising the steps of providing a jump table identifying an offset vector into the program memory of the array controller for each command to be executed, said offset vector indicating the location of code in the program memory to be executed in response to the received command.

103. The method as set forth in claim 102, wherein the offset vector points to an index location in the program memory, said index location identifying a starting address of the code to be executed from the program memory.

104. The method as set forth in claim 103, further comprising the step of configuring the jump table to map multiple commands to a single offset vector to permit multiple classes of commands, distinguished by the hardware configuration of the flash memory system, to utilize the same code, thereby supporting multiple hardware configurations without modification of the flash memory system.

105. The method as set forth in claim 104, further comprising the step of generating at least one hardware configuration signal in conjunction with the transmission of the offset vector to identify different hardware configurations.

106. The method as set forth in claim 103, wherein code executed in response to a command can be changed by modifying the starting address stored in the index location to reference a different portion of the program memory.

107. The method as set forth in claim 101, further comprising the steps of:

receiving code to be executed to perform an update of the program memory;

temporarily storing the received code;

receiving a command to update the program memory; and updating the program memory by executing the code temporarily stored;

wherein the code executed pursuant to a specific command can be modified or code corresponding to additional commands can be added to the program memory.

108. The method as set forth in claim 101, wherein said commands comprise commands to program and erase the flash array.

* * * * *

UNITED STATES PATENT AND TRADEMARK OFFICE
CERTIFICATE OF CORRECTION

| | | |
|---|---|---|
| PATENT NO. | : | 5,509,134 |
| DATED | : | April 16, 1996 |
| INVENTOR(S) | : | Fandrich et al. |

It is certified that error appears in the above-identified patent and that said Letters Patent is hereby corrected as shown below:

In column 4, at line 7, delete "front" and substitute --from--.

In column 8, at line 61, delete "In *this" and substitute --In this--.

In column 20, at line 40, delete "a" and substitute --the--.

In column 26, at line 6, delete "is the" and substiute --is to--

Signed and Sealed this

Twenty-ninth Day of October 1996

Attest:

BRUCE LEHMAN

Attesting Officer

Commissioner of Patents and Trademarks